United States Patent
Kostrzewski et al.

(10) Patent No.: US 11,914,435 B2
(45) Date of Patent: Feb. 27, 2024

(54) SYSTEMS AND METHODS FOR FRACTAL COOLING

(71) Applicant: MERCURY MISSION SYSTEMS, LLC, Andover, MA (US)

(72) Inventors: Andrew Kostrzewski, Garden Grove, CA (US); Kang S. Lee, Tustin, CA (US); Christopher LaMontagna, Torrance, CA (US)

(73) Assignee: MERCURY MISSION SYSTEMS, LLC, Andover, MA (US)

( * ) Notice: Subject to any disclaimer, the term of this patent is extended or adjusted under 35 U.S.C. 154(b) by 807 days.

(21) Appl. No.: 16/826,103

(22) Filed: Mar. 20, 2020

(65) Prior Publication Data

US 2021/0294396 A1 Sep. 23, 2021

(51) Int. Cl.
*G06F 1/20* (2006.01)
*H05K 7/20* (2006.01)
*F01D 5/18* (2006.01)

(52) U.S. Cl.
CPC .............. *G06F 1/20* (2013.01); *F01D 5/182* (2013.01); *H05K 7/20172* (2013.01)

(58) Field of Classification Search
CPC ............ H05K 7/20136; H05K 7/20172; F01D 5/182; G06F 1/20
See application file for complete search history.

(56) References Cited

U.S. PATENT DOCUMENTS

| | | | | |
|---|---|---|---|---|
| 3,251,196 A | * | 5/1966 | Watkins | F25B 49/02 236/44 R |
| 9,382,914 B1 | * | 7/2016 | Sharfi | H01L 23/367 |
| 2002/0080564 A1 | * | 6/2002 | Lee | H02K 17/12 361/678 |
| 2005/0163614 A1 | * | 7/2005 | Chapman | F04D 29/30 415/206 |
| 2012/0190293 A1 | * | 7/2012 | Badenhorst | F24F 13/065 454/284 |
| 2013/0209294 A1 | * | 8/2013 | Iwamoto | F04D 25/0613 417/423.14 |
| 2014/0000852 A1 | * | 1/2014 | Kim | F24F 1/005 454/284 |
| 2019/0032912 A1 | * | 1/2019 | Xie | F21V 33/0096 |
| 2020/0253084 A1 | * | 8/2020 | Van Pelt | G06F 1/20 |

(Continued)

FOREIGN PATENT DOCUMENTS

CN 208442043 U * 1/2019 ............... G06F 1/20

OTHER PUBLICATIONS

CN 208442043 U mt (Year: 2019).*

*Primary Examiner* — Gordon A Jones
(74) *Attorney, Agent, or Firm* — Sheppard, Mullin, Richter & Hampton LLP

(57) ABSTRACT

A vibrorotational fluid flow actuator includes: a first vibrorotational component comprising a first body including an axis, a plurality of first legs extending from a bottom surface of first body in a direction of and at an angle to the axis, and a plurality of first blades extending from a respective side of the first body in a direction perpendicular to the axis, wherein when the first vibrorotational component is placed on a chassis, vibration of the chassis induces rotation of the body such that the blades and body rotate about the axis of the body thereby inducing fluid flow in a fluid surrounding the actuator.

10 Claims, 20 Drawing Sheets

(56) References Cited

U.S. PATENT DOCUMENTS

| | | | |
|---|---|---|---|
| 2020/0400136 A1* | 12/2020 | Pinkerton | F04B 43/046 |
| 2021/0195790 A1* | 6/2021 | Cho | H05K 7/20172 |
| 2021/0257882 A1* | 8/2021 | Tian | H02K 1/14 |
| 2022/0043491 A1* | 2/2022 | Huang | H05K 7/20145 |
| 2022/0141973 A1* | 5/2022 | Wang | H05K 7/20172 |
| | | | 361/679.46 |
| 2022/0264765 A1* | 8/2022 | Vijayrao | H01L 23/467 |
| 2022/0290684 A1* | 9/2022 | Lin | F04D 29/282 |

* cited by examiner

SYSTEMS AND METHODS FOR FRACTAL COOLING

TECHNICAL FIELD

The disclosed technology relates generally to techniques for system cooling. More particularly, some embodiments relate to effective heat management for electronic systems and, in particular, to a mission computer (MC) mechanical packaging, improving its heat transfer out to the ambient environment.

DESCRIPTION OF THE RELATED ART

Electronic systems in general, and mission electronics in particular, are experiencing an increase in processing power and capability, while at the same time, being offered in smaller and smaller package sizes. Electronic systems are facing ever increasing pressure to provide increased performance and integrated capabilities, while being further constrained by size, weight, power and cost (SWaP-C) considerations. The increased performance is often due to factors such as consolidation of multiple legacy systems, increased processing requirements, increased throughput requirements and increased data-storage requirements. These factors often conspire to drive up the amount of heat generated by the electronics in question, stressing the thermal management aspects of the design.

Ineffective thermal management can lead to premature failure of electronics components, limited performance or system functionality or cause failure in extreme environments. It can also lead to dangers with respect to human factors considerations, such as where touch temperatures exceed acceptable values. As system performance requirements continue to increase while constrained by Swap-C, effective thermal management becomes more critical to system functionality, longevity and human factors.

Heat generated by avionics electronic components, for example, builds up within the system's enclosures, leading to reduced mean time between failures (MTBF) that might compromise system functionality and, in many cases, can lead to catastrophic failures. Military avionic systems are especially vulnerable due to the extreme operational temperature requirements that are as high as 80° C. in ambient temperature.

Standard thermal management systems relay on forced or free-air convection and/or conduction, liquid cooling, state-changing materials, immersion cooling, and thermoelectric cooling. Due to the sensitive nature of the electronic components, the free or forced-air cooling is only available at external enclosure walls or internal sealed tunnels, limiting its effectiveness. Moreover, the forced-air cooling relays on the air flow generators, utilizing undesirable mechanical motion of fans or blades that might have an even lower MTBF than that of the cooled system.

The conductive cooling requires a direct heat path from the heat-generating component to the heatsink. Modern avionics systems with a large number of electronic cards complicate the conductive heat transfer due to an intricate heat transfer geometry (only through connected metallic parts). This approach significantly increases the weight of the system, making it more vulnerable to vibration. Providing thermal pads between key heat-generating components and the chassis improves the heat transfer, but it is used on selected components and not the entire board, limiting its effectiveness. Thermal pads' thicknesses must be carefully selected to provide sufficient compressibility, requiring a multiple-pad thickness per single board.

BRIEF SUMMARY OF EMBODIMENTS

Embodiments of the systems and methods disclosed herein relate to the electronic system packaging aimed at improving thermal performance, including in extreme environments. In any commercial and military application, it is often desirable to provide efficient cooling of electronic systems to assure long-term operations without failures. The same holds true for other environments as well. Efficient heat transfer can be accomplished by removing hot air surrounding the electronic circuitry near an electronic module as well as a module assembly. Improved hot-air removal from both the module and module assembly is accomplished in some embodiments by converting the vibration energy of the platform into a rotation of a turbine-like structure. Because the vibration frequencies can vary in a large range, the scale of these turbines may vary accordingly. Because these turbines only differ in scale, they can be referred to as fractal turbines. At the lowest scale, the entire system assembly acts as a turbine with individually packaged boards acting as the turbine blade sensitive to the low frequency platform vibration. At the highest scale, the smallest turbine rotates in accordance to the highest vibration frequencies. These turbines are oriented such that they can resonate with complex platform oscillations (direction and amplitude). They are also referred to as fractal fluid-flow actuators. In some implementations, the smallest scale fractal-level turbine in a fractal turbine is embedded into a next-level turbine blade. Embodiments may include an array of nested turbines embedded in this manner.

According to various embodiments of the disclosed technology, a fractal vibrorotational fluid flow actuator may include: a primary vibrational fluid flow actuator may include: a primary central body portion including a central axis, a plurality of primary blades extending radially from an outer circumference of the primary central body portion; and a plurality of primary tines positioned to contact a surface of a device; wherein when the primary vibrorotational fluid flow actuator is placed such that at least one of the plurality of primary tines are in physical contact with the device, and vibration of the device induces rotation of the primary vibrorotational fluid flow actuator such that the primary blades and primary central body portion rotate about the axis of the primary central body portion thereby inducing fluid flow in a fluid surrounding the fractal primary fluid flow actuator; a plurality of secondary vibrational fluid flow actuators, each positioned on a respective blade of the plurality of primary blades of the primary vibrational fluid flow actuator. Each of the plurality of secondary vibrational fluid flow actuators may include: a secondary central body portion including a central axis, a plurality of secondary blades extending radially from an outer circumference of the secondary central body portion; and a plurality of secondary tines positioned to contact a surface of the respective blade of the plurality of primary blades on which the secondary vibrational fluid flow actuator is positioned; wherein when the secondary vibrorotational fluid flow actuator is placed such that at least one of the plurality of secondary tines are in physical contact with the surface of the respective blade, vibration of the respective blade induces rotation of the secondary vibrorotational fluid flow actuator such that the secondary blades and secondary central body portion rotate about the axis of the secondary central body portion thereby inducing fluid flow in a fluid surrounding the secondary fluid flow actuator.

The plurality of primary tines may include tines positioned on at least one of an outer periphery of the primary vibrational fluid flow actuator, an inner surface of the primary central body portion the primary vibrational fluid flow actuator, a top surface of the primary central body portion the primary vibrational fluid flow actuator and an inner surface of the primary central body portion the primary vibrational fluid flow actuator.

The vibrorotational fluid flow actuator may also include a second plurality of secondary vibrational fluid flow actuators, each positioned on a respective blade of the plurality of primary blades of the primary vibrational fluid flow actuator.

The primary vibrational fluid flow actuator may further include a band positioned around an outer edge of the plurality of primary blades and further wherein the plurality of primary tines are positioned about an outer surface of the band. The band may include a continuous band encircling an outer edge of the plurality of primary blades. The band may include a plurality of band segments wherein each segment is attached to the outer edge of a corresponding one or more of the plurality of primary blades, and wherein a tine of the plurality of primary tines is disposed on an outer surface of a band segment.

The plurality of secondary tines may include tines positioned on an outer periphery of each secondary vibrational fluid flow actuator, wherein when a secondary vibrorotational fluid flow actuator is positioned on its respective primary blade within a wall surrounding the secondary vibrorotational fluid flow actuator circumferentially and at least some of the tines are in physical contact with an inner surface of the wall, vibration of the primary vibrorotational fluid flow actuator induces rotation of the secondary vibrorotational fluid flow actuator such that the secondary blades and secondary central body portion rotate about the axis of the secondary central body portion thereby inducing fluid flow in a fluid surrounding the secondary vibrorotational fluid flow actuator. A secondary vibrorotational fluid flow actuator may further include a band positioned around an outer edge of the plurality of secondary blades, and wherein the plurality of secondary tines of the secondary vibrorotational fluid flow actuator are positioned about an outer surface of the band.

The vibrorotational fluid flow actuator may also include a plurality of tertiary vibrational fluid flow actuators, each positioned on a respective blade of the plurality of secondary blades of the secondary vibrational fluid flow actuator, each of the plurality of tertiary vibrational fluid flow actuators including: a tertiary central body portion including a central axis, a plurality of tertiary blades extending radially from an outer circumference of the tertiary central body portion; and a plurality of tertiary tines positioned to contact a surface of the respective blade of the plurality of secondary blades on which the tertiary vibrational fluid flow actuator is positioned; wherein when the tertiary vibrorotational fluid flow actuator is placed such that at least one of the plurality of tertiary tines are in physical contact with the surface of the respective secondary blade, vibration of the respective secondary blade induces rotation of the tertiary vibrorotational fluid flow actuator such that the tertiary blades and tertiary central body portion rotate about the axis of the tertiary central body portion thereby inducing fluid flow in a fluid surrounding the tertiary fluid flow actuator.

The tertiary vibrorotational fluid flow actuator may further include a band positioned around an outer edge of the plurality of tertiary blades, and wherein the plurality of tertiary tines of the tertiary vibrorotational fluid flow actuator are positioned about an outer surface of the band.

In another embodiment, a vibrorotational fluid flow actuator may include: a first vibrorotational component comprising a first body including an axis, a plurality of first legs extending from a bottom surface of first body in a direction of and at an angle to the axis, and a plurality of first blades extending from a respective side of the first body in a direction perpendicular to the axis, wherein when the first vibrorotational component is placed on a chassis, vibration of the chassis induces rotation of the body such that the blades and body rotate about the axis of the body thereby inducing fluid flow in a fluid surrounding the actuator.

A vibrorotational fluid flow actuator may include: a central body portion including a central axis, a plurality of blades extending radially from an outer circumference of the central body portion; a band positioned around an outer edge of the plurality of blades; a plurality of tines positioned about an outer surface of the band; wherein when the vibrorotational fluid flow actuator is placed within a bracket surrounding the vibrorotational fluid flow actuator circumferentially and at least some of the tines are in physical contact with an inner surface of the bracket, vibration of the bracket induces rotation of the vibrorotational fluid flow actuator such that the blades and central body portion rotate about the axis of the body thereby inducing fluid flow in a fluid surrounding the vibrorotational fluid flow actuator.

The vibrorotational fluid flow actuator may also include a plurality of tines disposed in a circular pattern about at least one of upper and lower surfaces of the body portion. The band may include a continuous band encircling an outer edge of the plurality of blades.

The band may include a plurality of band segments wherein each segment is attached to the outer edge of a corresponding one or more of the plurality of blades, and wherein a tine of the plurality of tines is disposed on an outer surface of a band segment.

A vibrorotational fluid flow actuator may include: a hollow central body portion including a central axis dimensioned to be positioned about a shaft of an electronic device; a plurality of blades extending radially from an outer perimeter of the hollow central body portion; a plurality of tines positioned about an inner surface of the hollow central body portion; wherein when the vibrorotational fluid flow actuator is positioned around the shaft of the electronic device and at least some of the tines are in physical contact with an outer surface of the shaft, vibration of the shaft induces rotation of the vibrorotational fluid flow actuator such that the blades and central body portion rotate about the shaft thereby inducing fluid flow in a fluid surrounding the vibrorotational fluid flow actuator.

The vibrorotational fluid flow actuator may also include a plurality of tines positioned about an outer surface of the band.

Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of any inventions described herein, which are defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

FIG. 15, which comprises

Some of the figures included herein illustrate various embodiments of the disclosed technology from different viewing angles. Although the accompanying descriptive text may refer to such views as "top," "bottom" or "side" views, such references are merely descriptive and do not imply or require that the disclosed technology be implemented or used in a particular spatial orientation unless explicitly stated otherwise.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

As would be apparent to one of ordinary skill in the art after reading this description, the technology disclosed herein can be used with any of a number of different electronic components and systems. For ease of discussion, some aspects of the technology are described in the context of an application to a circuit card housed in a mechanical housing or chassis.

Figure 1:
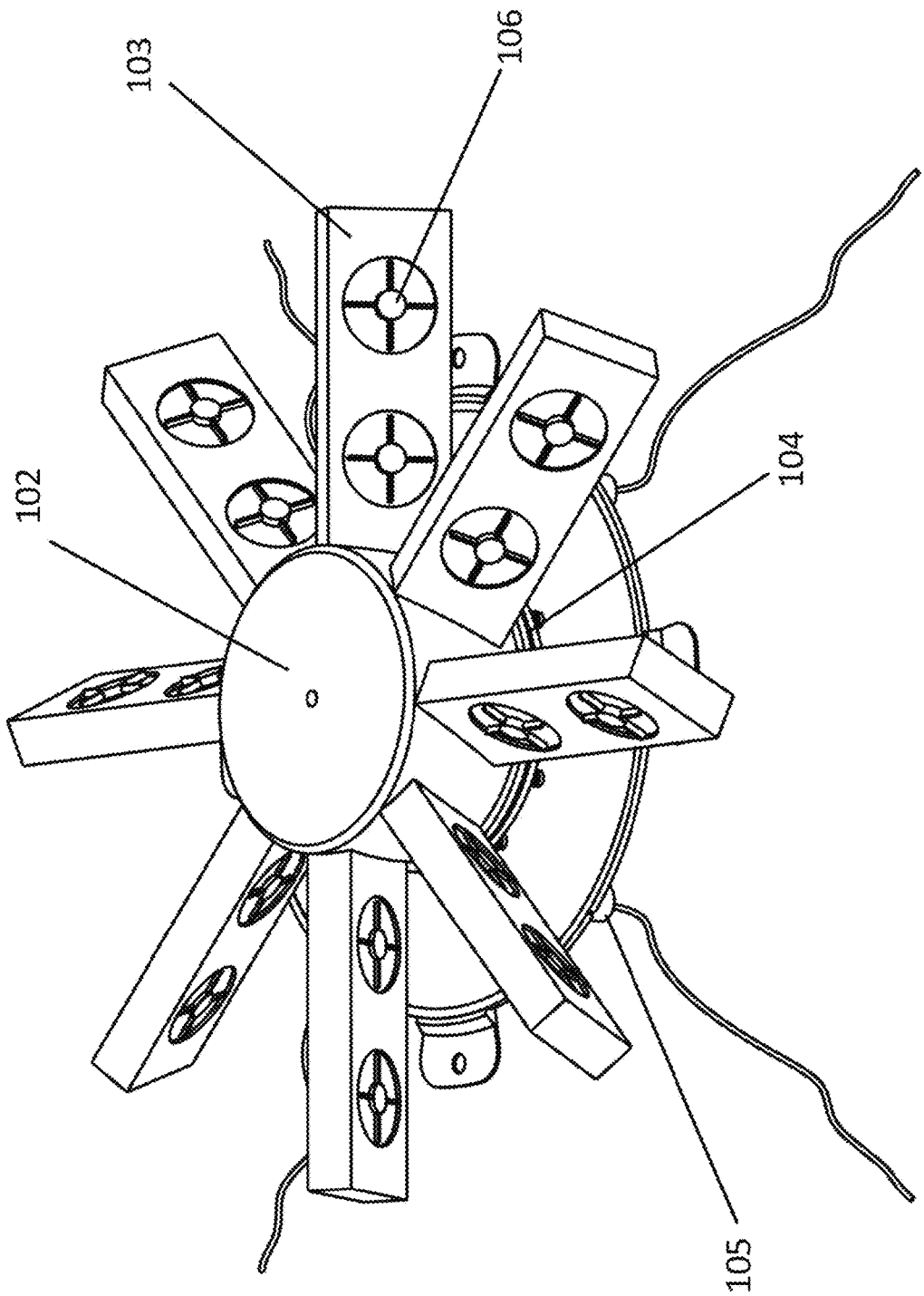
FIG. 1 illustrates a simplified example of the fractal cooling system at the lowest scale level in accordance with various embodiments.

As would be apparent to one of ordinary skill in the art after reading this description, the technology disclosed herein can be used with any of a number of different electronic components and systems. For ease of discussion, some aspects of the technology are described in the context of an application to a circuit card housed in a mechanical housing or chassis FIG. 1 illustrates a simplified example of the fractal cooling system at the lowest scale level. In this example, low frequency platform vibration will cause system body 102 to rotate. Plurality of packaged electronic modules 103 are rigidly attached to the 102 body. Each electronic module 103 is inclined to cause surrounding air movement during 102 body rotation. External system connectivity is provided by a plurality of external connectors 105. Since the 102 body rotates and the connectors 105 are stationary, a slip ring 104 provides electric signal connectivity between platform and electronic modules 103. Each electronic module 103 contains plurality of nested turbines 106 oriented at different inclinations harnessing multidirectional platform vibration.

Figure 2:
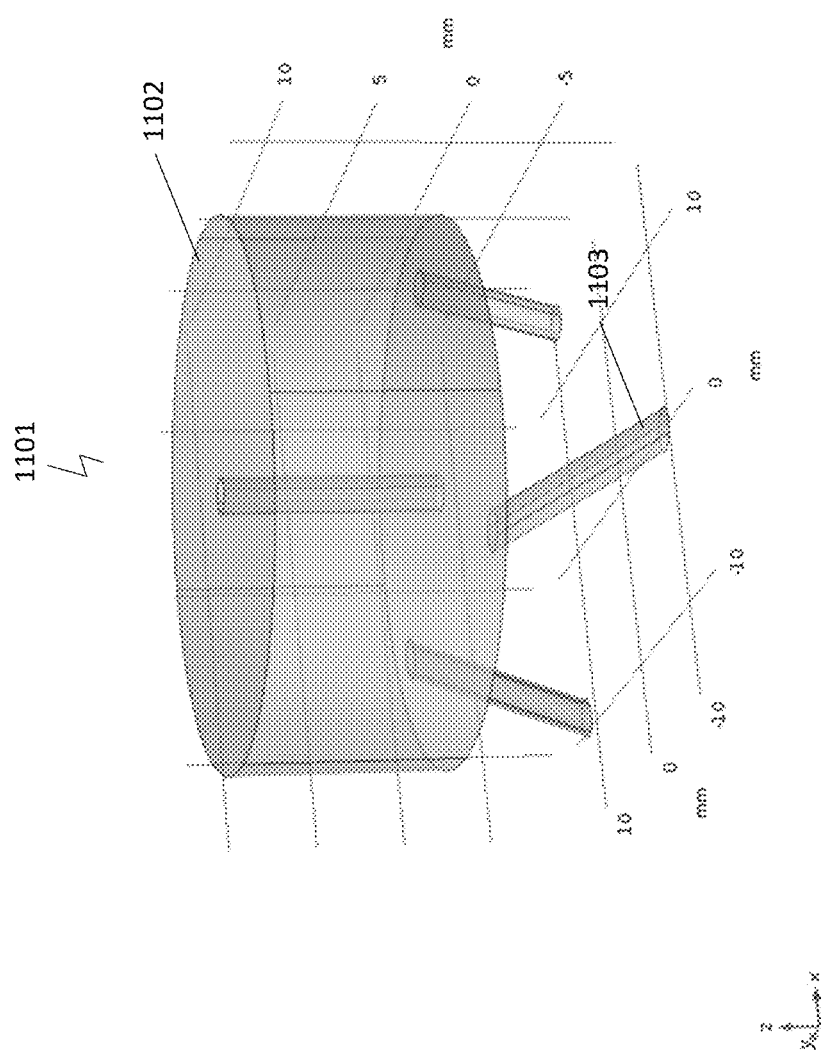
FIG. 2 illustrates a simplified example of a vibrorotational component in accordance with various embodiments.

FIG. 2 illustrates a simplified example of a vibrorotational component in accordance with one embodiment. In this example, the vibrorotational component 1101 includes a body 1102 and a plurality of legs 1103. In this example, body 1102 is cylindrical in shape and 3 legs are provided in a spaced relation around the axis of body 1102. The legs are angled so that they do not extend perpendicularly from the bottom surface of body 1102. The legs are angled in the same direction relative to a circle surround the axis of body 1102.

Figure 3:
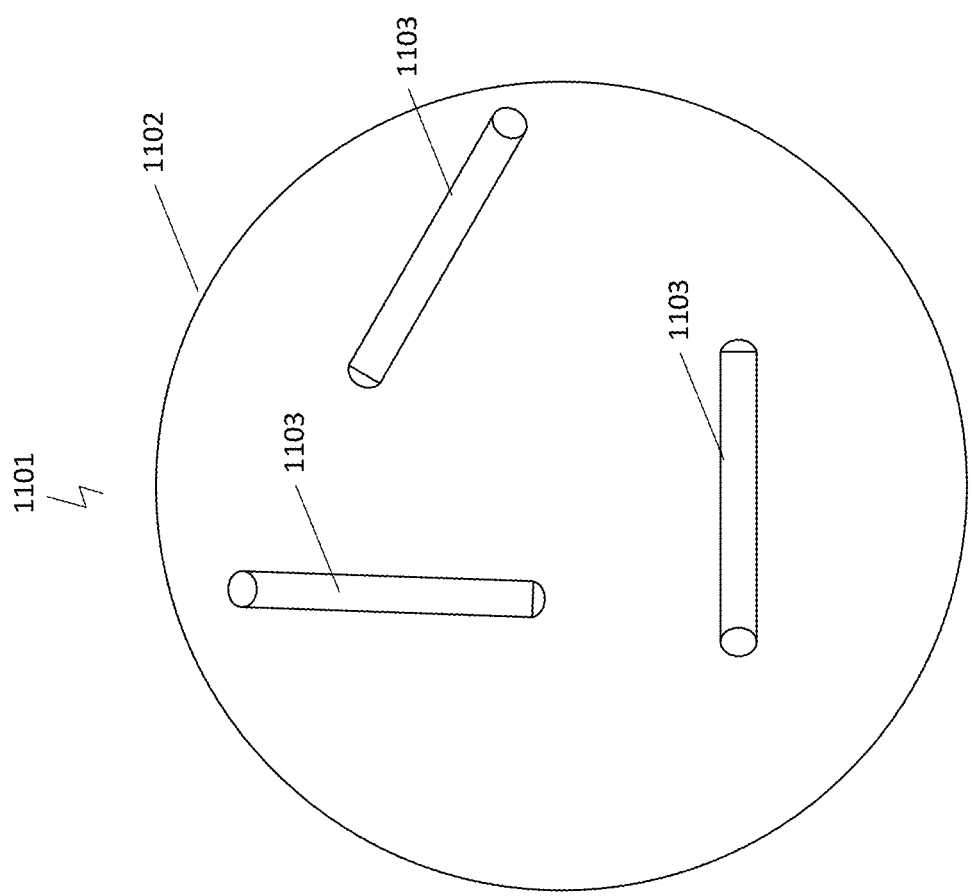
FIG. 3 illustrates a top-down view of component 1101 illustrating an example of angled legs in accordance with various embodiments.

FIG. 3 illustrates a top-down view of component 1101 illustrating an example of angled legs. In this example, 3 legs 1103 are attached at the bottom of body 1102 at 3 points spaced $2\pi/3$ about a circle having the axis of the cylinder has its center point. In other embodiments, other quantities of legs 1103 may be attached. Although the legs are evenly spaced around body 1102, even spacing is not mandatory. In operation, vibrations of a surface on which vibrorotational component 1101 is placed causes the legs 1103 to flex, storing potential energy in the legs. The legs spring back, causing the body to rotate about its axis. The legs should be stiff enough that they are able to spring back and impart rotational motion on body 1102. However, they should be sufficiently flexible to be able to store potential energy.

The stiffness of the each legs can be described as $k(\text{stiffness}) = F(\text{Normal Force})/Y$, where $Y=$deflection or $k(\text{stiffness}) = F/Y = 3EI/L^3$ where E=Youngs Modulus, I=Leg Moment of Intertia, and L=Leg Length.

The Leg Moment of intertia, assuming circular cross-section, can be described as $I = PI\ r^4/4$ Where PI=3.1415"; and r=radius of the leg.

Therefore, the legs deflection can be described as $Y = 4FL^3/(3E\ PI\ r^4)$

Therefore, the larger the area moment of inertia, the less a structure deflects (greater stiffness).

Due to manufacturing limits, the radius (r) of the leg should be minimal, and may be as small as 0.010", for example, in some implementations.

Design Parameters may include but are not limited to the following seven parameters.

Figure 4:
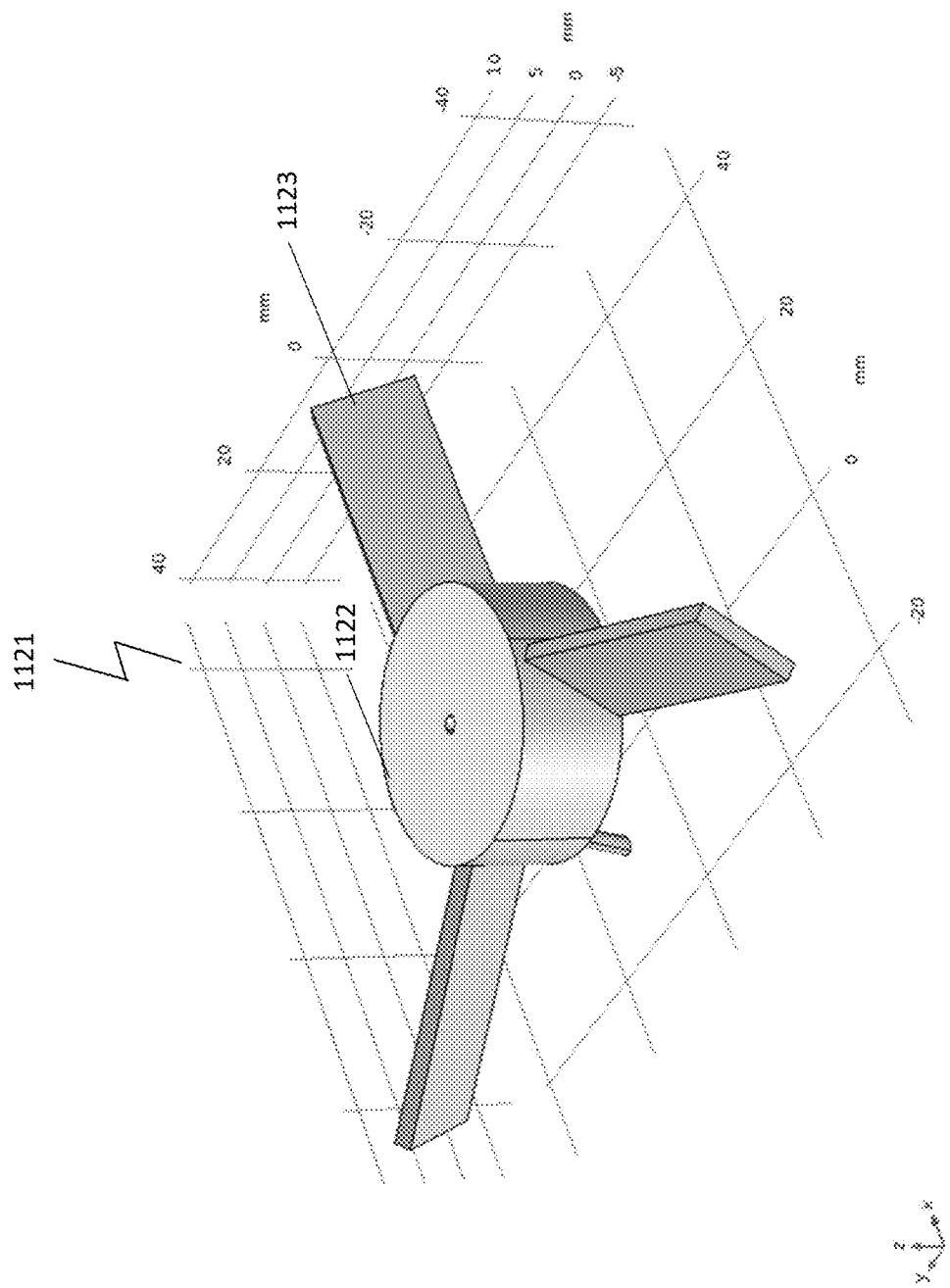
FIG. 4 provides a perspective view of a vibrorotational component implemented as a fan in accordance with various embodiments.
Figure 5:
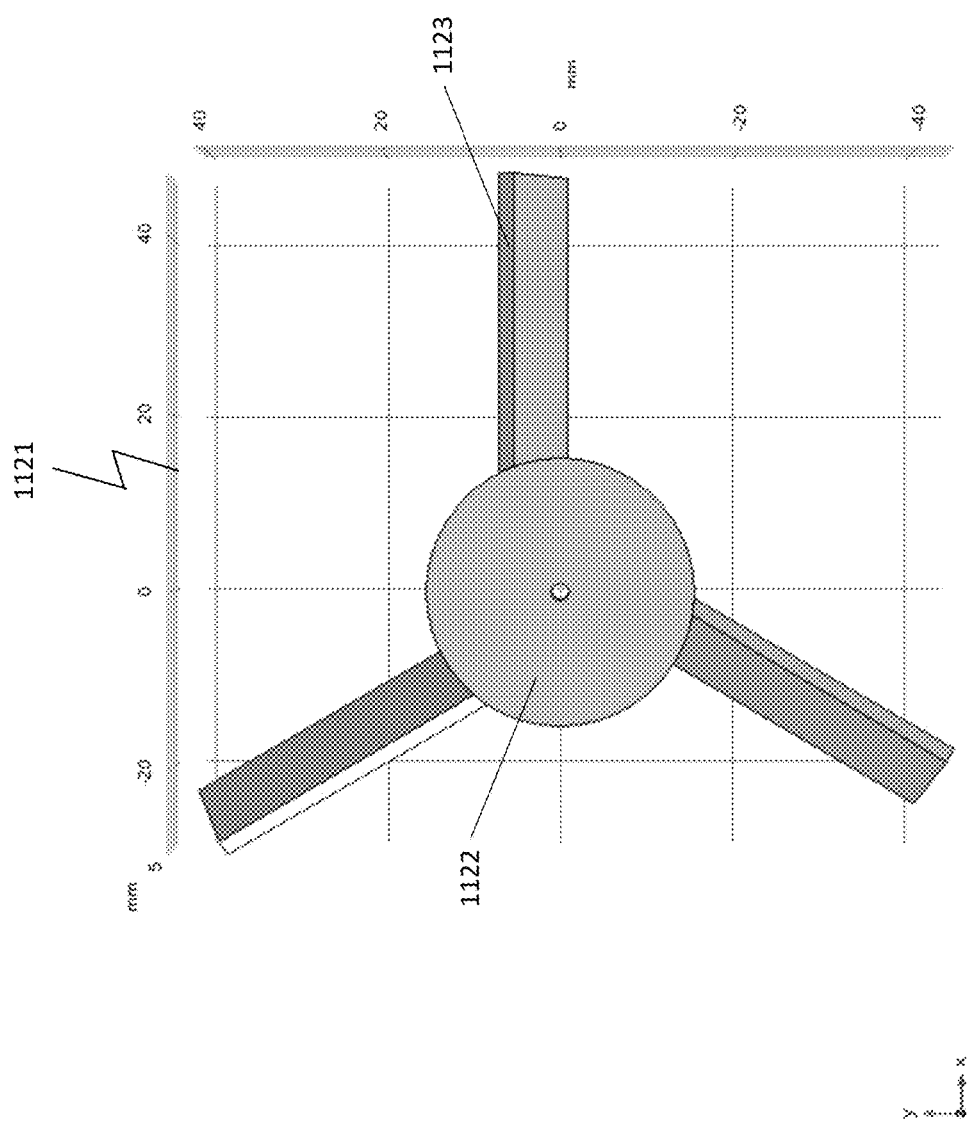
FIG. 5 provides a top-down view of a vibrorotational component implemented as a fan in accordance with various embodiments.
Figure 6:
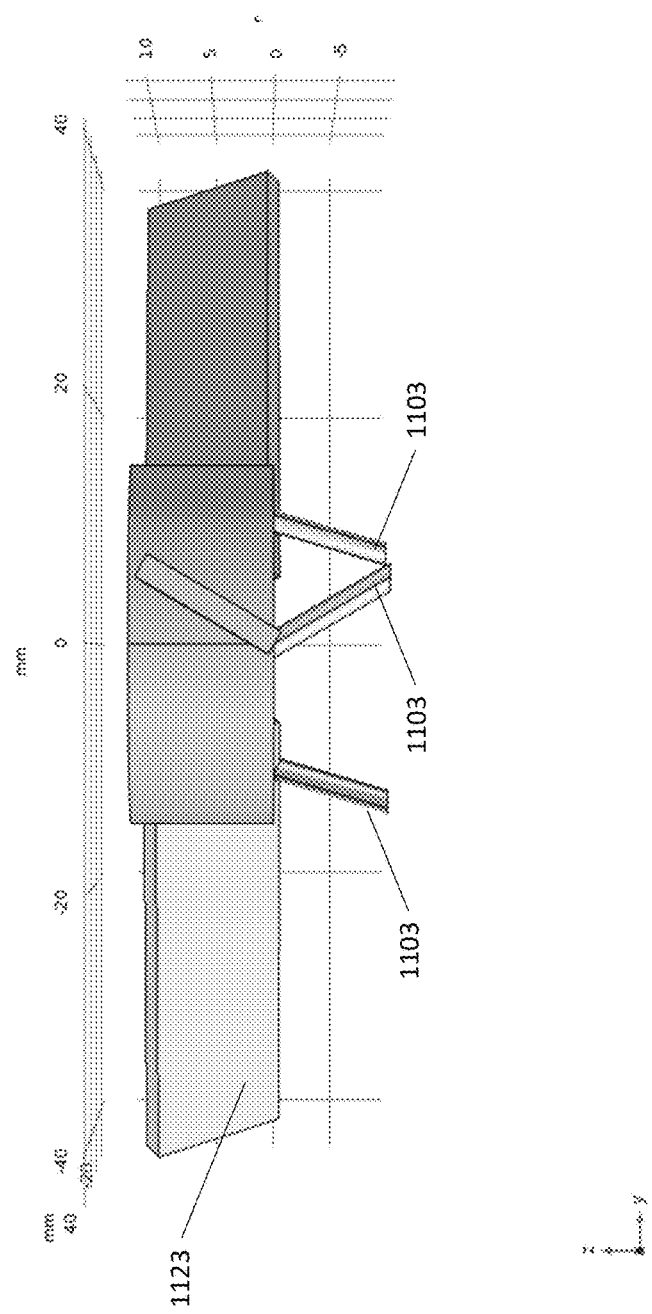
FIG. 6 provides a side view of a vibrorotational component implemented as a fan or fluid flow actuator in accordance with various embodiments.

1) Degrees of freedom—a rigid leg is not necessarily the most efficient solution. Parallels could be drawn from human, animal, robotic, or other studies relying on mobility, gaits, energy capture and release, etc. Considerations for free state pose and pose at maximum deflection should be considered.
2) Shape, topology, roughness, etc. of the interacting surface (foot)—a flat face is very unlikely to be the most optimal interface.
3) Material or materials—a solid material may not be the best solution. Composite material(s), combinations of materials either fixed permanently or fastened together, etc. may be taken into consideration with respect to efficiency, power, manufacturability, and cost effectiveness.
4) Cross section(s) of the actuating volume(s)—fine tuning of the moment of inertia of the actuating features (legs) with respect to stiffness control in all 3 axis (with respect to FIG. 2 those orientations could be described as radial, normal, and tangent aka R, phi, theta in spherical coordinates.
5) Number of legs.
6) Mass.
7) Effective damping FIGS. 4-6 provide an example of how, in various embodiments, vibrorotational component 1101 can be extended to provide cooling, or more generally, fluid flow. FIG. 4 provides a perspective view of a vibrorotational component implemented as a fan; FIG. 5 provides a top-down view of a vibrorotational component implemented as a fan; and FIG. 6 provides a side view of a vibrorotational component implemented as a fan or fluid flow actuator. In this example, vibrorotational component 1121 includes blades 1123 extending from body 1122 in a perpendicular direction. In this example, blades 1123 are angled such that they move air (or other fluid) in the + or − z-direction, depending on the direction of rotation. Accordingly, a vibrorotational component can be used to convert vibrational energy into air movement. Longitudinal vibration of a chassis on which the actuator is placed induces rotation of the body such that the blades and body rotate about the axis of the body thereby inducing fluid flow in the + or −z-direction in a fluid surrounding the actuator.

Figure 7:
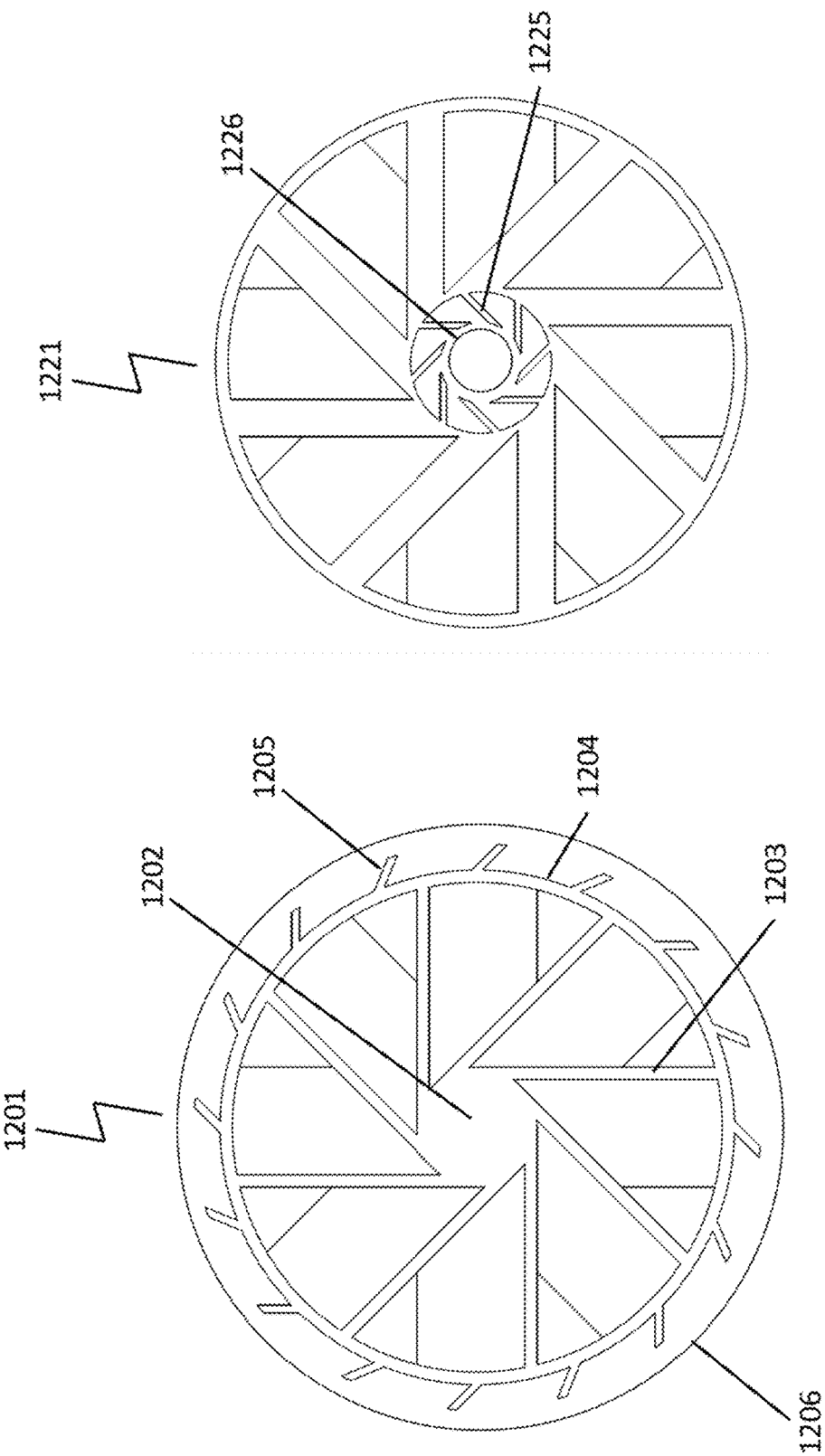
FIG. 7 provides additional examples of how a of a vibrorotational component implemented as a fluid flow actuator can be used to provide cooling through convection in accordance with various embodiments.

FIG. 7 provides additional examples of how a of a vibrorotational component implemented as a fluid flow actuator can be used to provide cooling through convection. The left-hand side of FIG. 7 illustrates an example of an external boundary interface configuration for a vibrorotational component implemented as a fluid flow actuator. In this example, a series of fan blades, or veins 1203 extend radially from a central body 1202 of vibrorotational fluid flow actuator 1201. A band 1204 is wrapped around the outer edge of blades 1203 and a plurality of tines 1205 (e.g., like legs 1103 in the example of FIG. 3) are positioned about the outer surface of band 1204. Although band 1204 is illustrated as a continuous band encircling the outer edge of veins 1203, in other applications band 1204 can be noncontinuous as illustrated in the example of FIG. 8 discussed below.

In this example, vibrorotational fluid flow actuator 1201 may be placed within the confines of a cylindrical wall 1206. A screen, bars or other like fan cage (not shown for clarity) may be used to further confine vibrorotational fluid flow actuator 1201 within cylindrical wall 1206. Vibrations of cylindrical wall 1206 (or the fan cage) will cause vibrorotational fluid flow actuator 1201 to move about therein. When vibrorotational fluid flow actuator 1201 hits a portion of cylindrical wall 1206, a subset of the plurality of tines 1205 surrounding vibrorotational fluid flow actuator 1201 will impact cylindrical wall 1206. The tines in this subset of tines 1205 deflect, storing potential energy in those tines 1205. In reaction, those tines 1205 spring back causing vibrorotational fluid flow actuator 1201 to rotate about its axis. They also deflect vibrorotational fluid flow actuator 1201 toward another portion of cylindrical wall 1206. This deflection coupled with continued vibrations of the system will cause vibrorotational fluid flow actuator 1201 to impact another portion of cylindrical wall 1206 and continue the rotational motion.

The right-hand side of FIG. 7 illustrates an example of an internal boundary interface configuration for a vibrorotational component implemented as a fluid flow actuator. This example vibrorotational fluid flow actuator 1221 is similar to vibrorotational fluid flow actuator 1201 except that tines 1225 are mounted internally to the unit, on in the interior surface of a hollow central body portion 1222 such that they are proximate a shaft of an electronic device about which vibrorotational fluid flow actuator 1221 rotates. Hollow central body portion 1222 is dimensioned such that the body portion can be positioned around a shaft 1226. Similar to the operation of vibrorotational fluid flow actuator 1201, in this example tines 1225 can come into contact with shaft 1226. Vibrations of shaft 1226 impart potential energy on tines 1225 as one or more tines 1225 impact the outer surface of shaft 1226. The impacting tines or subset of tines 1225 spring back causing vibrorotational fluid flow actuator 1221 to deflect and rotate about shaft 1226. This deflection coupled with ongoing vibrations causes another subset of tines 1225 to impact shaft 1226 such that the rotational motion continues. Although not illustrated, in further embodiments a hybrid arrangement may be implemented in which a vibrorotational fan includes both external tines 1205 and internal tines 1225.

Figure 8:
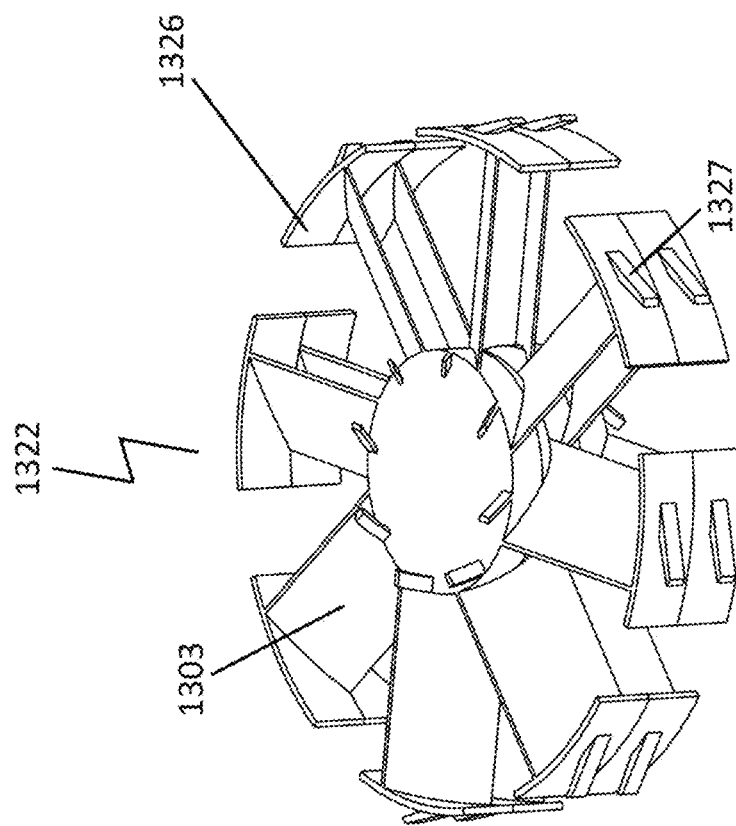
FIG. 8 illustrates another example of a vibrorotational fluid flow actuator in accordance with various embodiments.
Figure 8:
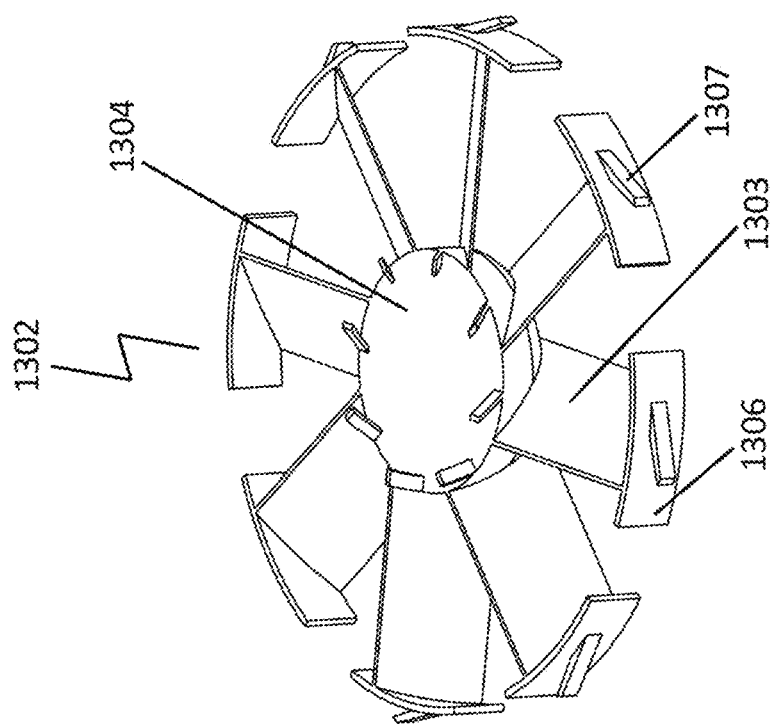

FIG. 8 illustrates another example of a vibrorotational fluid flow actuator in accordance with various embodiments. The example vibrorotational fluid flow actuator 1302 includes a plurality of blades 1303 extending radially from an external surface of central body portion 1304. At the end of each blade 1303 is a band segment 1306, and each band segment 1306 has a tine 1307 disposed thereon. In the illustrated example, the band is made up of a plurality of band segments 1306 wherein each segment 1306 is attached to the outer edge of a corresponding one of the plurality of blades 1303. Although not illustrated, a band segment could be attached to more than one blade. Like the tines in the example of FIG. 7, tines 1307 extend from the surface of their respective band segments 1306 at an angle such that their deflection resulting from impacting an outer wall (e.g., cylindrical wall 1206) and the consequential springing back causes vibrorotational fluid flow actuator 1302 to rotate in response to vibrations of the outer wall. In other words, vibration of the outer wall induces rotation of the vibrorotational fluid flow actuator such that the segments 1306 blades 1303 and central body portion 1304 rotate about the axis of the body thereby inducing fluid flow in a fluid surrounding the vibrorotational fluid flow actuator.

The example vibrorotational fluid flow actuator 1302 of FIG. 8 also includes a plurality of tines 1307 disposed in a circular pattern about the upper and lower surfaces (the lower surface not visible on FIG. 8) of central body portion 1304 of vibrorotational fluid flow actuator 1302. Including tines 1307 disposed both around the periphery of vibrorotational fluid flow actuator 1302 and about the upper and lower surfaces of central body portion 1304 can provide additional motivational force to impart rotational motion on vibrorotational fluid flow actuator 1302. Although not illustrated, in further embodiments vibrorotational fluid flow actuator 1302 may further include internal tines about a central aperture configured to accommodate a shaft.

FIG. 8 also illustrates a stacked arrangement of a vibrorotational fluid flow actuator 1322. In this example, two vibrorotational fluid flow actuators 1302 are combined in a stacked arrangement. In this example, tines 1327 are disposed on band segments 1326 at angles in an alternating configuration such that tines 1327 of one of the vibrorotational fluid flow actuators are angled in one direction while tines 1327 of the other fan are angled in the opposite direction.

In other embodiments the tines can be angled in the same direction. In fact, higher fluid flow will be achieved in this configuration if the tines in this stacked arrangement are in the same orientation as this would cause the upper and lower units to rotate in the same direction. Indeed, with no air gap between the upper and lower blades, the blades 1303 are angled in the same direction as shown, and the tines along the circumference of the outermost edges of the faces attached to the fan blades 1303 oriented to act in opposing directions, the upper and lower vibrorotational elements would effectively cancel each other out allowing almost no net airflow. Therefore, preferably to improve airflow, the tines should be oriented to be angled in the same direction or the blades 1303 on one unit (e.g. top) angled opposite to the blades 1303 on the other (e.g., bottom) unit. Alternatively, an air gap between the upper and lower components can be provided.

In other embodiments, the tines 1307 may all be angled in the same direction. Although FIG. 8 illustrates two actuators and a stacked arrangement, other embodiments may be implemented with a different quantity of vibrorotational fluid flow actuator in stacked arrangement.

Figure 9:
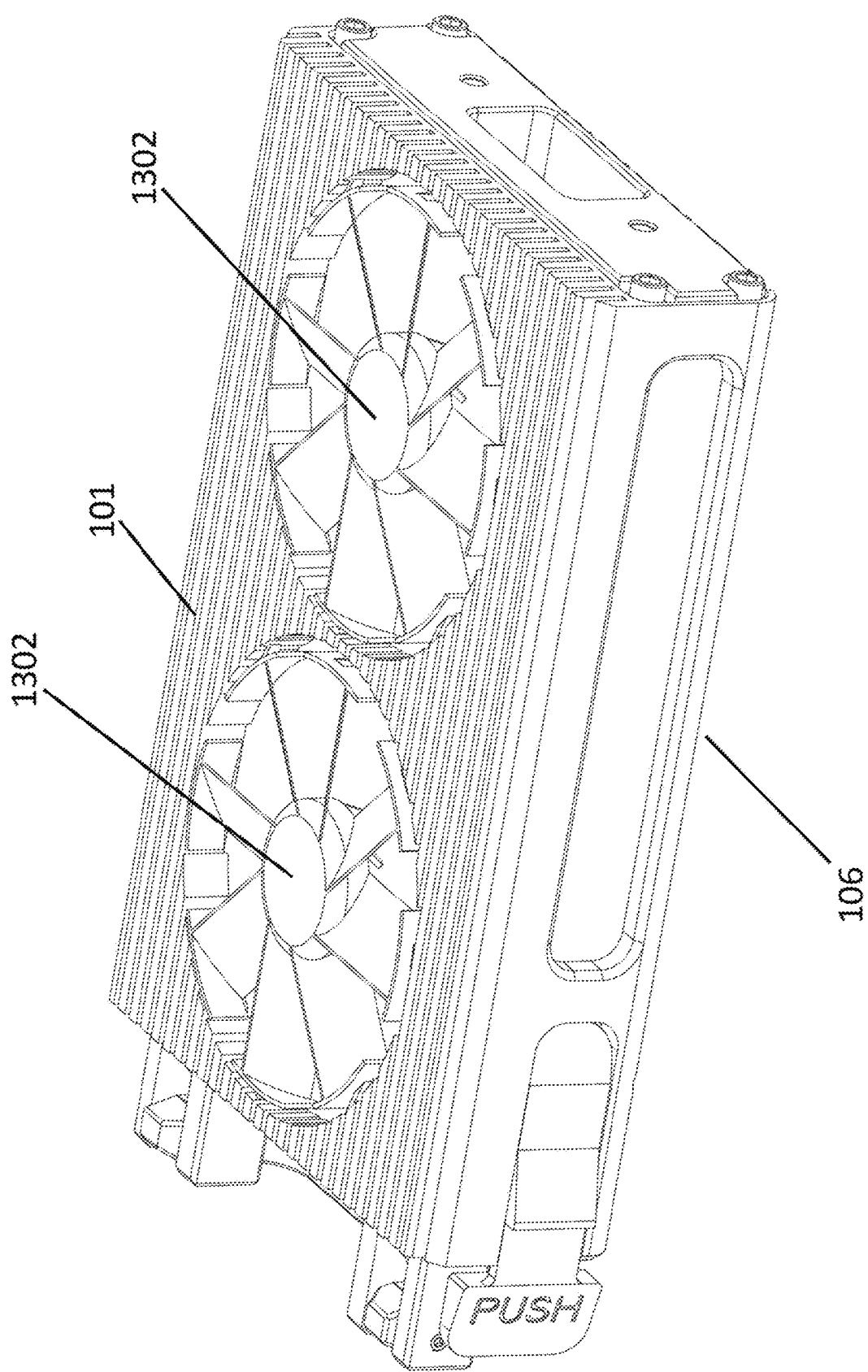
FIG. 9 illustrates an example in which a pair of vibrorotational fluid flow actuators are disposed in a wall of an equipment housing in accordance with various embodiments.

FIG. 9 illustrates an example in which a pair of vibrorotational fluid flow actuators are disposed in a wall of an equipment housing. More particularly, the example of FIG. 9 illustrates two vibrorotational fluid flow actuator 1302 disposed in circular cutouts of a chassis such as equipment chassis 101. The inner surfaces of the cutouts form cylindrical walls (e.g., cylindrical wall 1206) within which vibrorotational fluid flow actuator 1302 can rotate. Although not illustrated in FIG. 9, ribs, screen or other cage structure can be used to confine vibrorotational fluid flow actuators 1302 in the Z direction. Such a cage can include a flat central portion at each of the top and bottom portions of the cages to provide a flat surface against which tines 1307 on the surfaces of central body portion 1304 may operate. Also, one or more tines (e.g., tines 1205, 1225, 1307, 1327) can be included to induce rotation, but are not shown for clarity of illustration.

Figure 10:
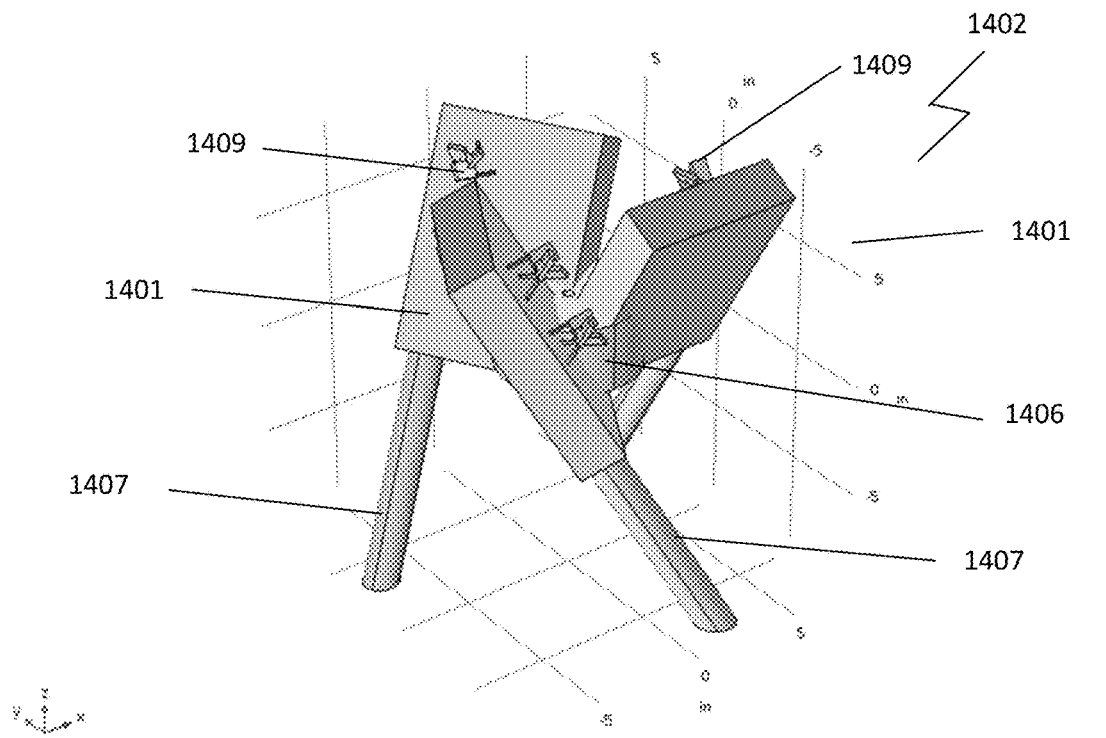
FIG. 10 illustrates in representative fashion an example of how multiple fans may be combined in a fractal nature to harvest vibrational energy along multiple axes in three dimensions in accordance with various embodiments.
Figure 10:
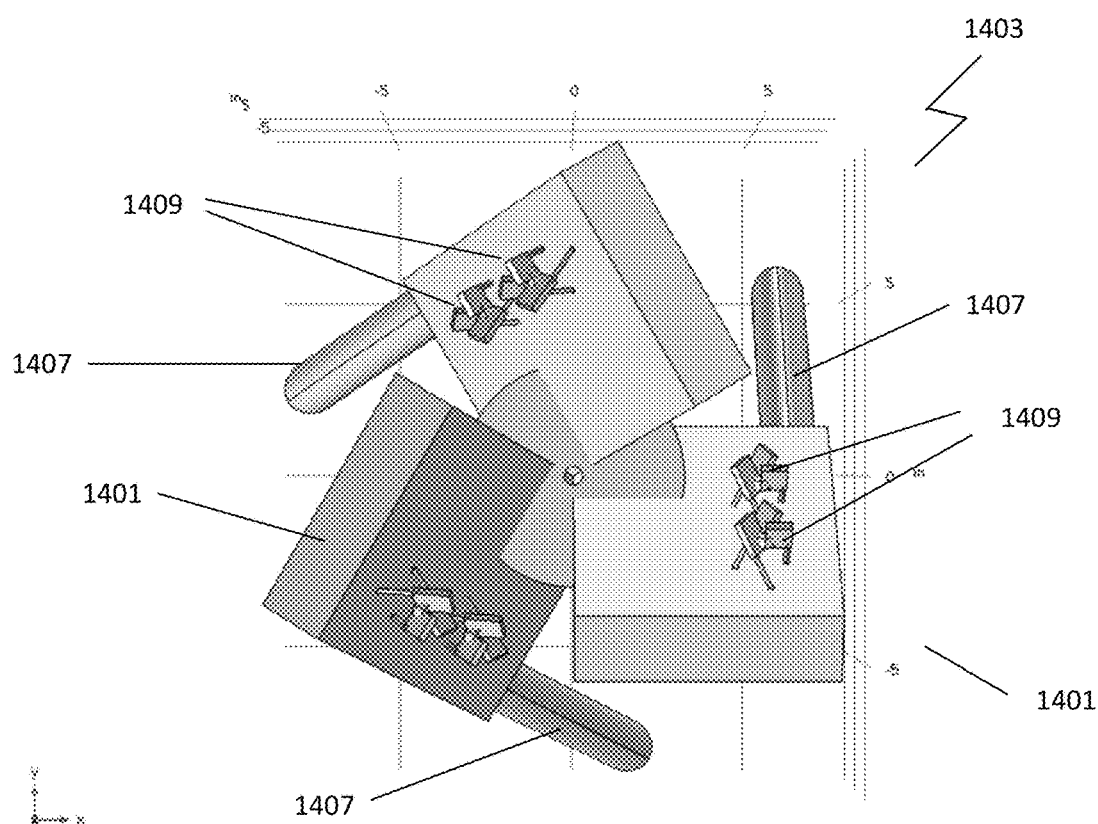

FIG. 10 illustrates in representative fashion an example of how multiple fans may be combined in a fractal nature to harvest vibrational energy along multiple axes in three dimensions. More particularly, this example illustrates a perspective view 1402 and a top-down view 1403 of a vibrorotational component 1401. Vibrorotational component 1401 includes a body 1406 and 3 legs 1407. Similar to the examples described above, the 3 legs are angled to provide rotational motion in response to vibrations in the Z direction. In this example, vibrorotational component 1401 also includes a plurality of smaller vibrorotational components 1409 positioned thereon. Because these smaller vibrorotational components 1409 have different orientations, they are able to convert vibrational energy in different directions into rotational motion. Although not illustrated, additional even smaller vibrorotational components can be placed on vibrorotational components 1409 to further capitalize on vibrational energy and various dimensions. This fractal arrangement can be continued in this manner through multiple levels. Although two smaller by vibrorotational components 1409 are illustrated on each of their respective larger portions of vibrorotational component 1401, other quantities of vibrorotational components 1409 (and smaller vibrorotational thereon, and so on through the various levels provided in a given implementation) can be used on one or more of the respective larger portions of each respective larger vibrorotational component (e.g., 1, 2, 3, 4, 5, 6, 7, . . . 10, . . . 20 (or even hundreds or thousands) of smaller vibrorotational components on their respective larger counterparts).

Figure 11:
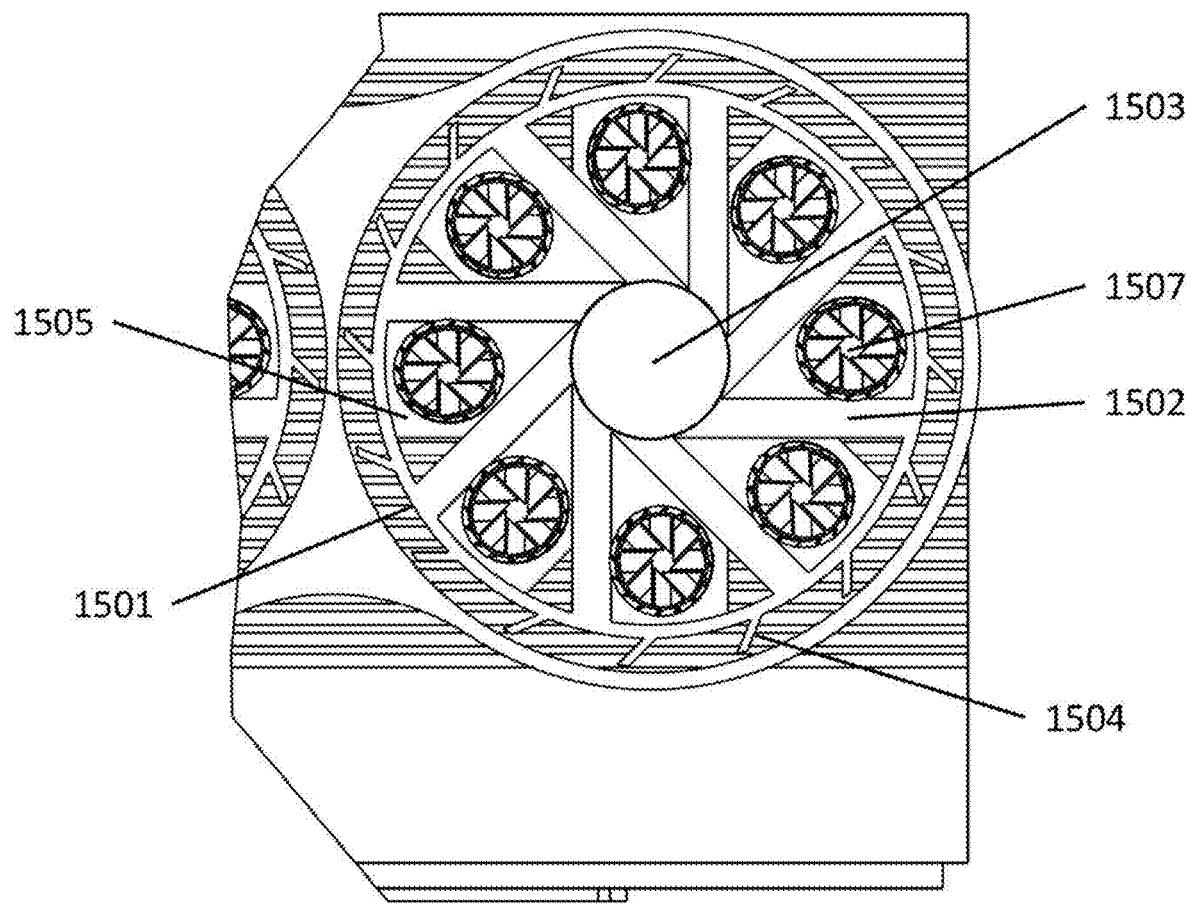
FIG. 11 illustrates another example of a fractal implementation of a vibrorotational fan in accordance with various embodiments.

FIG. 11 illustrates another example of a fractal implementation of a vibrorotational fan. In this example, a main or primary fan is provided with a plurality of primary fan blades 1502 projecting from a primary central hub 1503 and a plurality of primary tines 1504 disposed on a primary outer band 1505 surrounding primary blades 1502. This vibrorotational actuator 1501 to this extent is similar to vibrorotational actuator example illustrated at 1201 in FIG. 7. In a further implementation, fractal vibrorotational actuator 1501 can include internal tines (not shown) within a central hub of the unit or tines on the top/bottom surfaces of the central body portion.

Vibrorotational fluid flow actuator 1501 in this example further includes a plurality of smaller, or secondary, vibrorotational fans 1507 located within it. In this example, there are eight secondary vibrorotational fans 1507 included, one mounted on each of the 8 primary blades 1502. In this example, each secondary vibrorotational fans 1507 is mounted within an opening of its respective blade. Each of these secondary vibrorotational fans 1507 can have the same or similar configuration as vibrorotational fan 1501. In other words, each of the secondary vibrorotational fans 1507 can include a secondary central body portion including a central axis, a plurality of secondary blades extending radially from an outer circumference of the secondary central body portion; and a plurality of secondary tines positioned to contact a surface of the respective primary blade of the plurality of primary blades on which the secondary vibrational fluid flow actuator is positioned (e.g., the secondary vibrorotational fluid flow actuator is placed such that at least one of the plurality of secondary tines are in physical contact with the surface of the respective blade, vibration of the respective blade induces rotation of the secondary vibrorotational fluid flow actuator such that the secondary blades and secondary central body portion rotate about the axis of the secondary central body portion thereby inducing fluid flow in a fluid surrounding the secondary fluid flow actuator). The secondary tines contacting a surface of the respective primary blade is not limited to direct contact (e.g., inner surfaces of an aperture in the primary blade body itself), but can also include indirectly (e.g., such as by contacting a sleeve, liner, or other structure mounted within the aperture of the primary blade body).

Because these smaller vibrorotational fans 1507 are mounted on the blades 1502 of the larger vibrorotational fan 1501, and because blades 1502 are at an angle relative to the plan of vibrorotational fan 1501, smaller vibrorotational fans 1507 can take advantage of vibrations in a different dimension. This fan-in-a-fan, or fractal, configuration can provide additional airflow. In another iteration, another level of vibrorotational fans can be added to provide a fan-in-a-fan-in-a-fan configuration, providing even more airflow. These iterations can be continued to 3, 4, 5, 6, 7 or more levels of iteration. Also, embodiments can be implemented in which there are more than one smaller vibrorotational fan 1507 on each of the blades 1502, and these smaller vibrorotational fans 1507 may be of different diameters.

Figure 12:
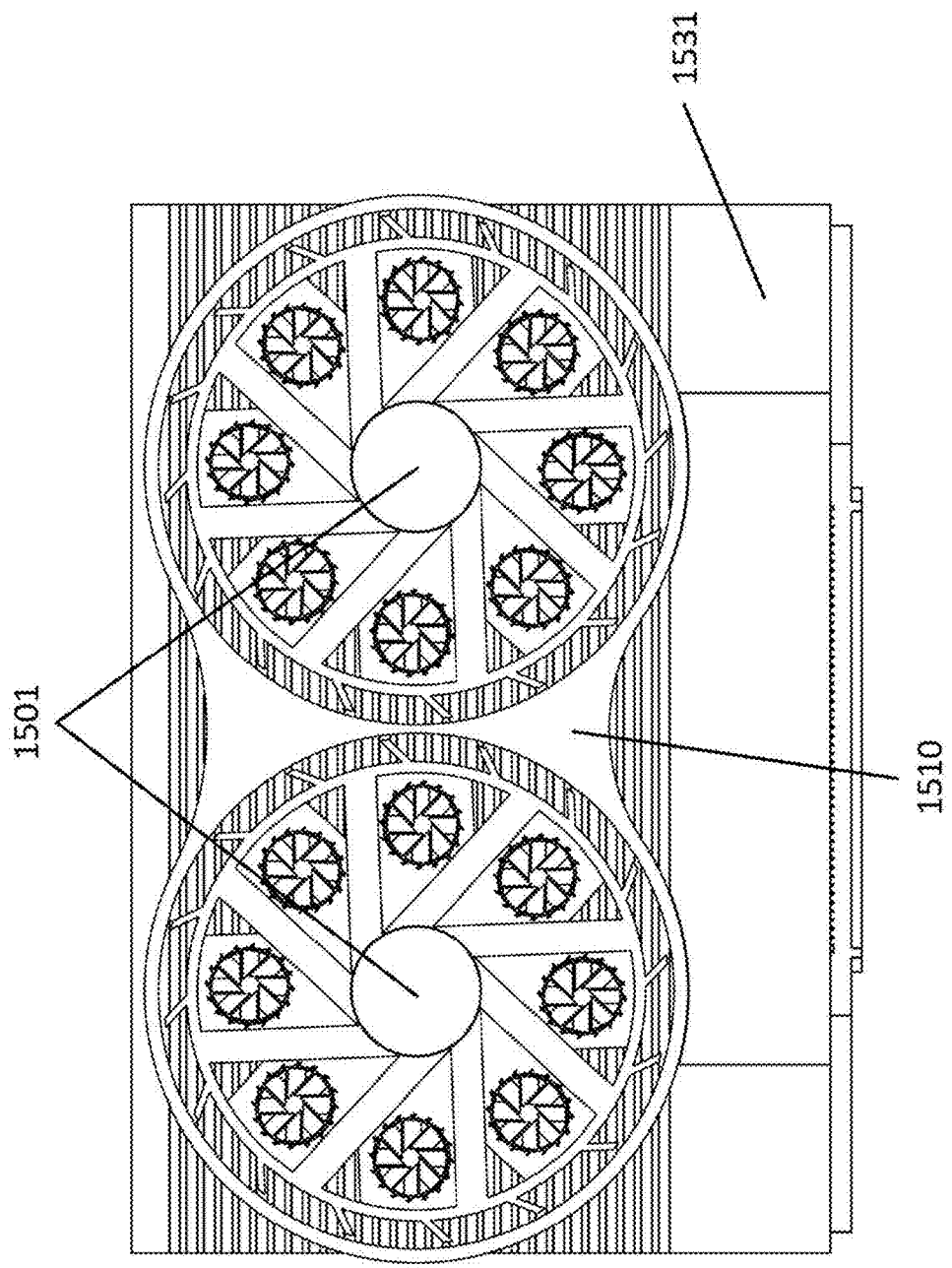
FIG. 12 illustrates a chassis with two two-level vibrorotational fans included to provide cooling of the chassis and the components therein in accordance with various embodiments.

FIG. 12 illustrates a chassis 1531 (e.g., chassis 101) with two two-level vibrorotational fans 1501 included to provide cooling of the chassis and the components therein. In this implementation, a fan cage can be provided that is separate from and attachable to chassis 1531. In other embodiments, the fan cage can be partially or entirely integrated with chassis 1531. Although this illustrates a two-fan, two-level, fan-in-a-fan configuration, other quantities of fan can be included and other levels of a fractal implementation can be used for the fans. Additionally, in further embodiments, vibrorotational fans 1501 on multiple surfaces of chassis 1531. In other words, for example, vibrorotational fans 1501 can be mounted on the top and bottom surfaces of chassis 1531. In other applications, geometry permitting, vibrorotational fans 1501 may also be mounted on the sides of a chassis. Further, vibrorotational fans may be sized to be appropriately accommodated by the chassis or other equipment with which they are implemented.

Figure 13:
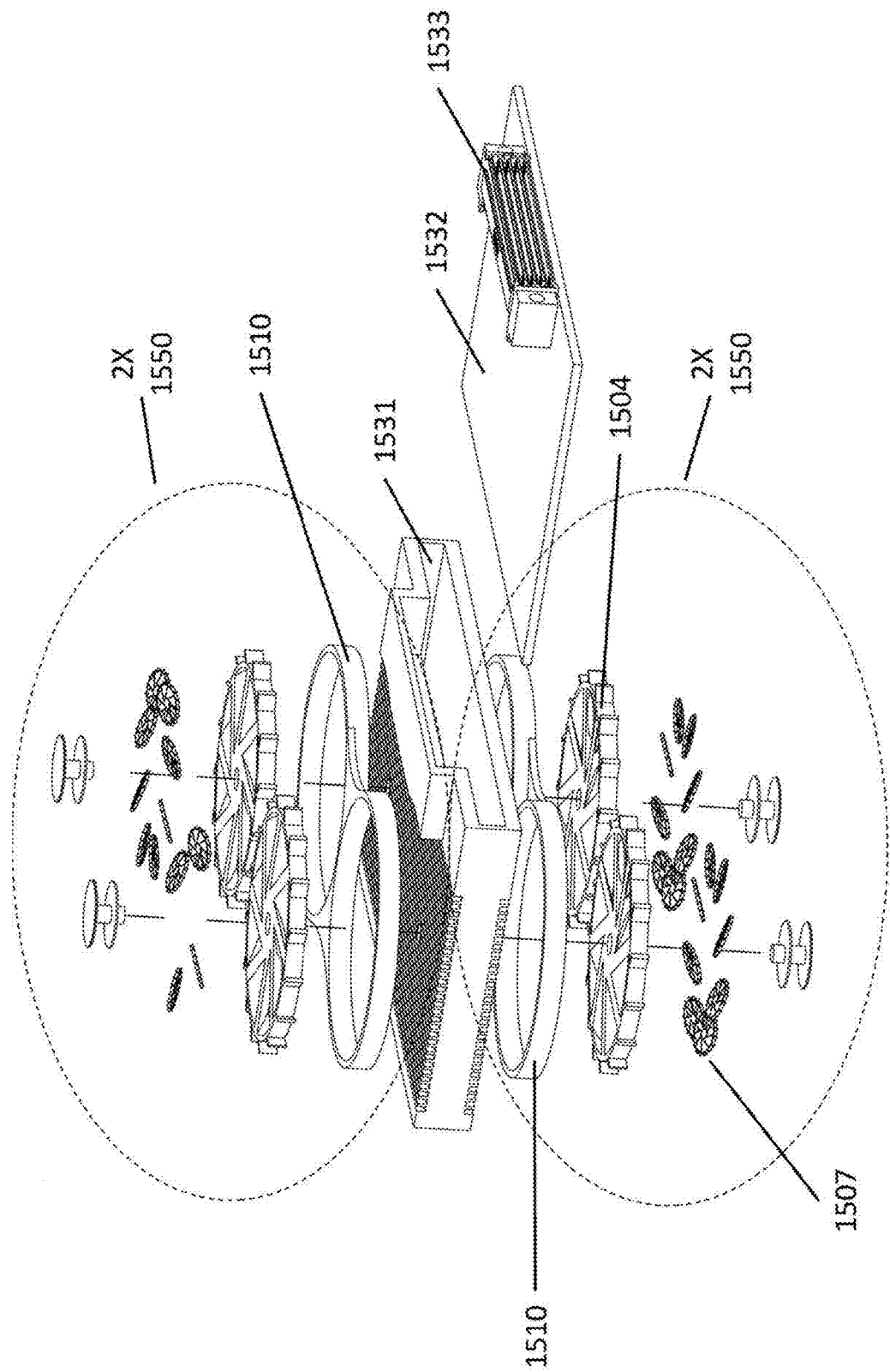
FIG. 13 illustrates an exploded view example of a chassis with four two-dimensional vibration powered fluid flow actuators to provide cooling in accordance with various embodiments.

FIG. 13 illustrates an exploded view example of a chassis with four two-dimensional vibration powered fluid flow actuators 1550 to provide cooling in accordance with one embodiment. In this example a chassis 1531 including one or more circuit boards 1532 with edge connectors 1533 is cooled by four two-dimensional vibration powered fluid flow actuators 1550 (e.g., vibrorotational fans 1501). This example illustrates two two-dimensional vibration powered fluid flow actuators 1550 on the top of chassis 1531 and two two-dimensional vibration powered fluid flow 1550 actuators on the bottom of chassis 1531. Other quantities of two-dimensional vibration powered fluid flow actuators may be used in various applications, and their placement may depend on factors such as available surface area and thermal properties of the chassis 1531.

A pair of dual-cylindrical frames 1510 (an integral unit connected at the center in this example, but can also be separate) are used to contain the two-dimensional vibration powered fluid flow actuators in the X and Y dimensions (e.g., forming a cylindrical wall 1206). They also provide a solid surface against which tines 1504 may interact. Dual cylindrical frames 1510 may be permanently or releasably fastened to chassis 1531 by various attachment means such as welds, rivets, screws, adhesives or other fastening mechanisms. Alternatively, dual cylindrical frames 1510 may be an integral part of chassis 1531.

This example exploded view further shows a plurality of smaller two-dimensional vibration powered fluid flow actuators 1507, each mounted on a vein 1505 of the larger two-dimensional vibration powered fluid flow actuators 1503. Center hub caps 1541 can be used to secure the larger two-dimensional vibration powered fluid flow actuators in place and provide a hub about which is actuators may rotate. Although not illustrated, similar, but smaller, hub caps can be used to secure the smaller two-dimensional vibration powered fluid flow actuators 1507 in place. In alternative applications, cross braces, cages or other like structures can be used to secure the larger and smaller two-dimensional vibration powered fluid flow actuators in place. Such cages can also include a solid central portion against which tines on a top/bottom surface of a central body portion of the fluid flow actuators may interact. Although the vibration powered fluid flow actuators are shown as two-dimensional actuators, in various applications n-dimensional actuators can be used. An advantage of increasing the dimension of the actuator over a single dimension is the ability to take advantage of vibrational energy in multiple dimensions. Trade-offs may be weight, complexity, or reduced performance based on decreased size of the actuator.

As these examples serve to illustrate, one or more vibration powered fluid flow actuators can be used to provide cooling to equipment or materials or can otherwise be used to induce fluid flow. The chassis with which these vibration powered fluid flow actuators may be implemented are not limited to the examples of chassis described herein. Instead, they can be implemented with any of a number of different equipment types and equipment configurations.

The various chassis with which vibration powered fluid flow actuators may be implemented can be mounted on a backplane or other like structure so that the equipment within the various chassis may be integrated into a system. Similarly, the various chassis may be mounted to provide a mounting structure regardless of whether they are integrated into a system. With conventional solutions, cards and other modules are often mounted on a backplane parallel to one another. This can allow heat generated from one module to contribute to the temperature of adjacent modules. In various embodiments, the chassis (e.g., cards, boards, enclosed assemblies or other electronic modules, such as chassis 1531) can be mounted on a cylindrical or other like backplane in the form of a mounting cylinder as an array of nodes that constitutes the veins of a larger fan.

Figure 14:
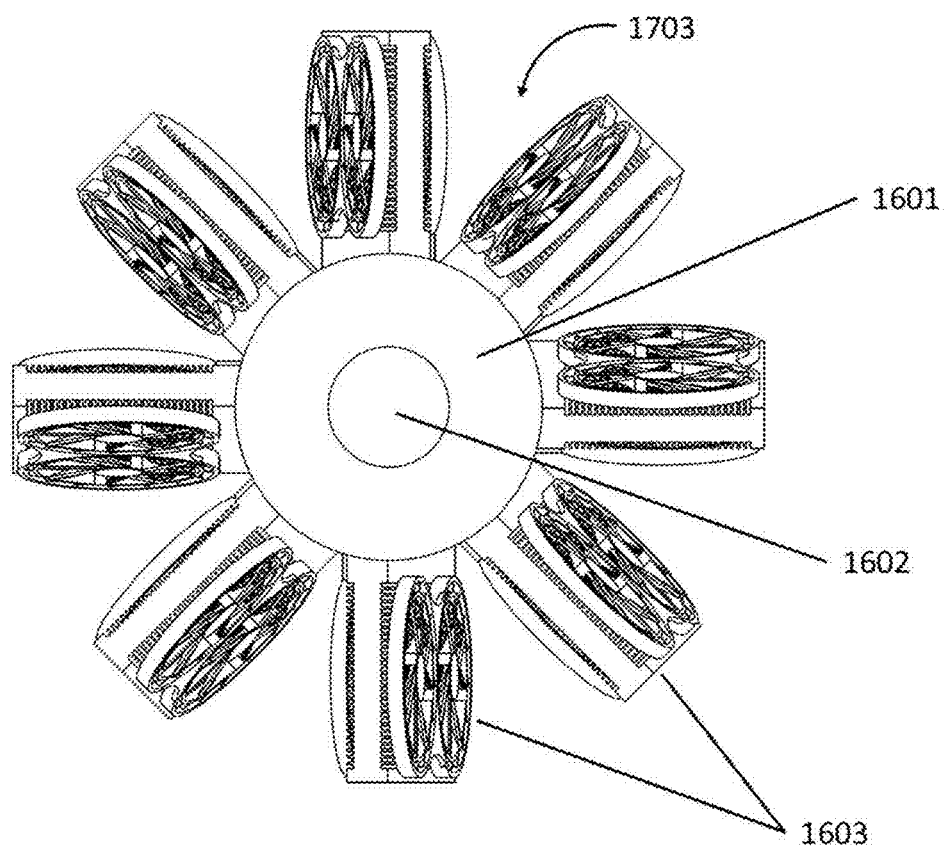
FIG. 14 is a diagram illustrating an example of a plurality of electronic modules mounted on a cylindrical hub in an end-on configuration in accordance with various embodiments.
Figure 15A:
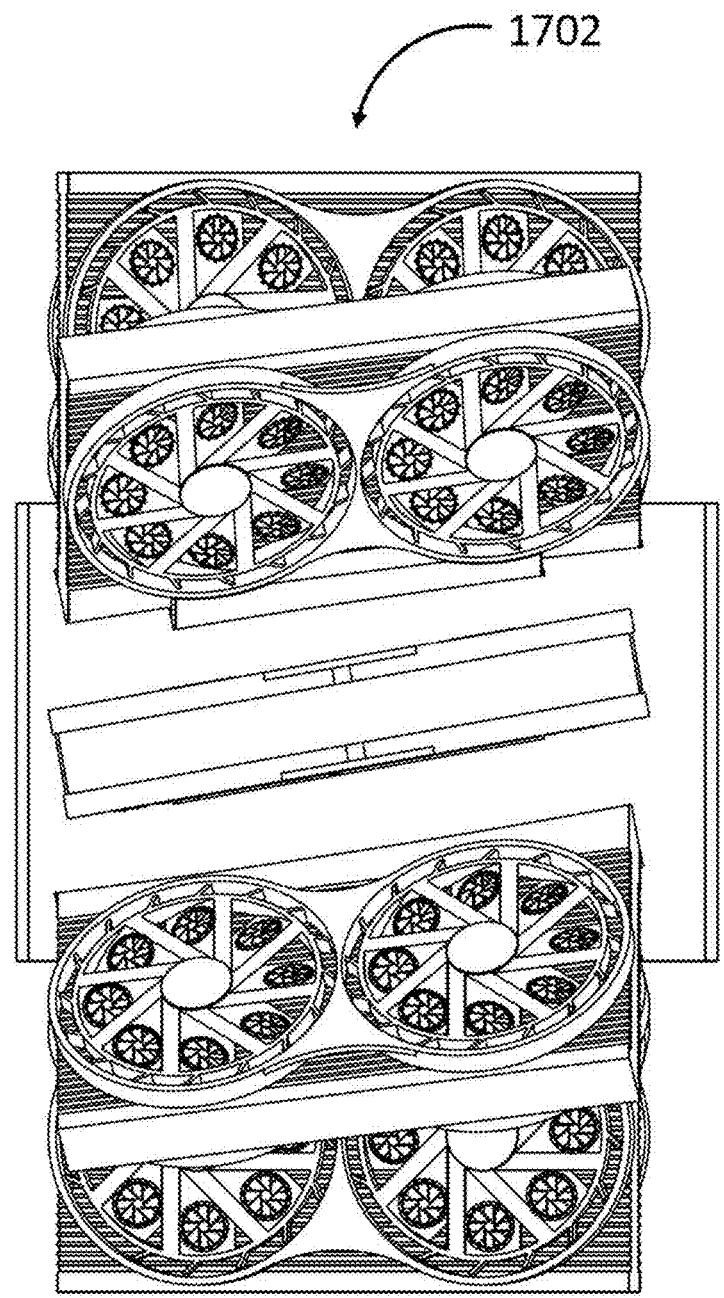
FIGS. 15A-D, illustrates an example of a fractal passive forced convection heat exchange system in accordance with various embodiments.
Figure 15B:
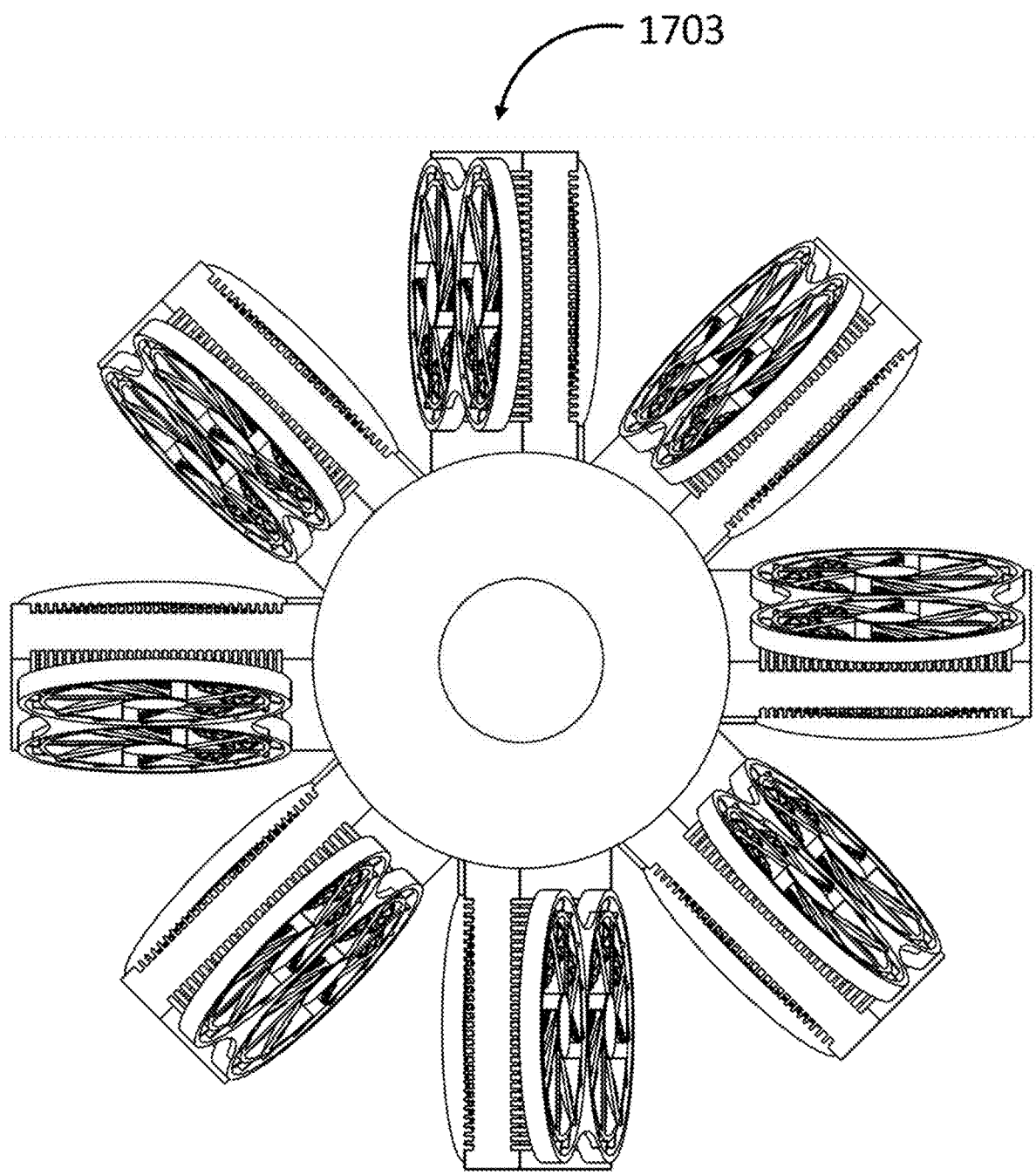
Figure 15C:
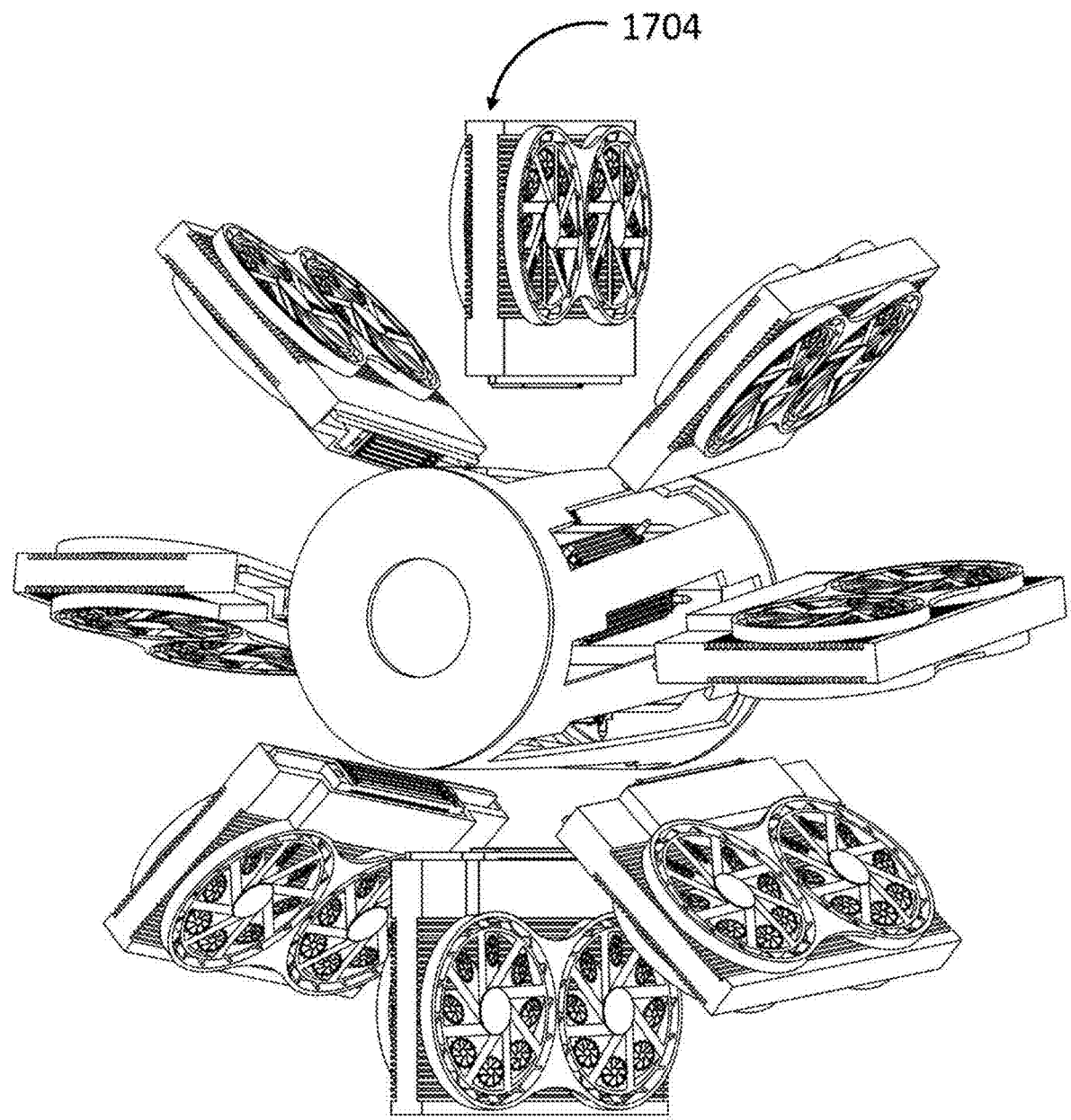
Figure 15D:
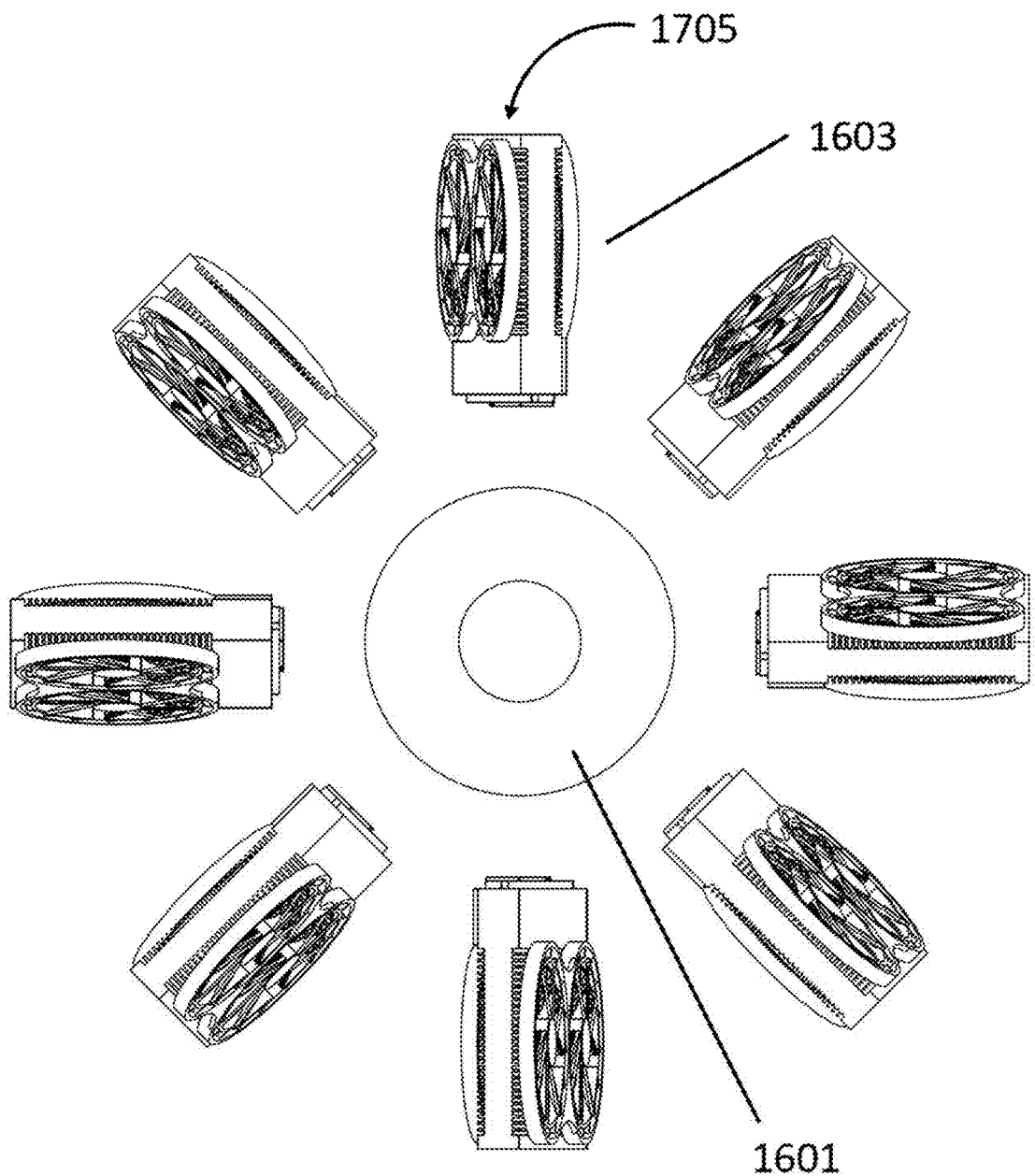

FIG. 14 is a diagram illustrating an example of a plurality of electronic modules (e.g., chassis 1531) mounted on a cylindrical hub in an end-on configuration, such that each of the electronic modules forms a vein of a fan extending radially from the center hub. In this example, center hub 1601 has a cylindrical geometry and includes an axial hole 1602 forming an open cylinder. The outer surface of center hub 1601 need not be cylindrical, and it can have other geometries including, for example, pentagonal, hexagonal, heptagonal, octagonal, and so on. A plurality of electronic modules 1603 are mounted about the outer perimeter of center hub 1601. In this example, eight modules 1603 are included. However, in other applications, other quantities of modules 1603 may be mounted on center hub 1601. Electronic modules 1603 may be mounted such that they are perpendicular with the base of center hub is 1601. In other embodiments, the may be mounted at an angle relative to a line perpendicular to the base of center hub 1601.

Center hub 1601 may be mounted on a central structure such as an axle or other core (not illustrated in FIG. 14) defining an axis about which center hub may rotate. In some applications, the axle may include splines that correspond with complementary splines on the inner surface of the axial hole 1602 such that the axle may impart rotational motion on the system, or vice versa. In other applications, the axle and the inner surface of the axial hole 1602 may be relatively smooth to allow free rotation of the center hub about the axle. In yet further applications, the interior surface of axial hole 1602 may include tines such that the center hub structure can convert vibrational energy to rotational energy causing the center hub structure to rotate about the axes in response to vibrations present in the system.

FIG. 15, which comprises FIGS. 15A-D, illustrates an example of a fractal passive forced convection heat exchange system in accordance with one embodiment. This example illustrates side 1702, perspective 1703, perspective exploded 1704 and top-down exploded 1705 views of a system such as that illustrated in FIG. 14. Modules 1603 are mounted about the exterior surface of center hub 1601. In this example, modules 1603 can be similar to the modules illustrated in FIG. 23 with four n-level fans mounted on the exterior surface of each chassis.

Side view 1702 and exploded perspective view 1704 illustrate how modules 1603 can be mounted at an angle relative to the axis of the cylinder. Because of this mounting, modules 1603 can act as veins of a fan and induce airflow in the axial direction based on rotation of the system. Various connectors and connector types can be used to provide physical and electrical attachment of modules 1603 to center hub 1601.

Figure 16:
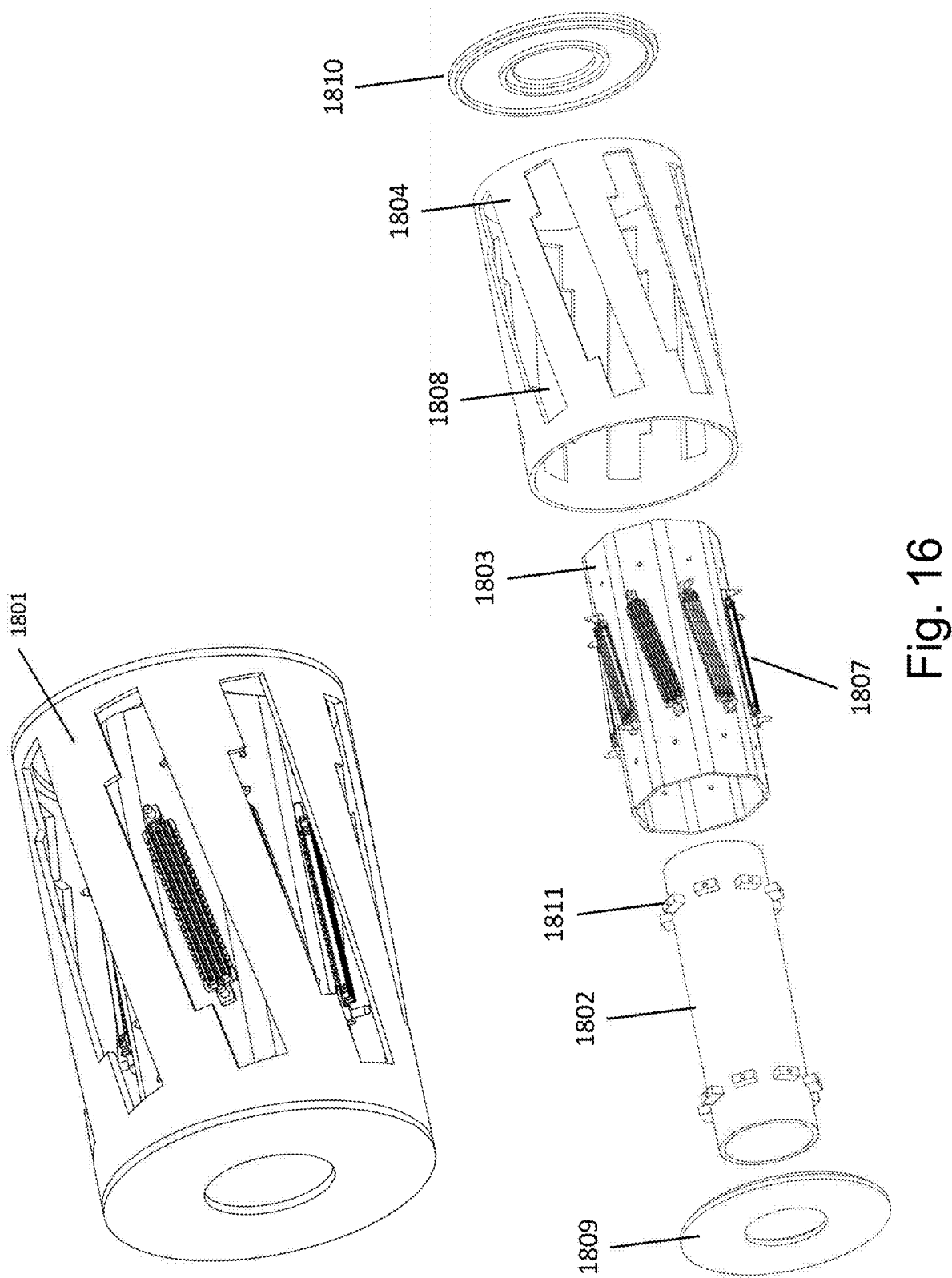
FIG. 16 illustrates an exploded view of an example implementation of a center hub in accordance with various embodiments.

FIG. 16 illustrates an exploded view of an example implementation of a center hub in accordance with one embodiment. In this example, the center hub 1801 (e.g., center hub 1601) includes a structural core 1802, a circuit board 1803, a structural face 1804, and front and rear panels 1809, 1810. Structural core 1802, structural face 1804 and front and rear panels 1809, 1810 may together or indent handedly provide structural support for center hub 1801 such that the unit can rotate about its axes in support a plurality of circuit modules.

Circuit board 1803 may be a flexible or rigid circuit board or it may combine flexible and rigid portions, and it may include electrical traces and other electrical connections to allow electrical signals to be shared amongst the various modules (e.g. modules 1603) or between the modules and external components. Traces on circuit board 1803 may also provide power (e.g., VCC) and ground for circuits on circuit board 1803 and for the modules connected thereto. Electrical, mechanical or electromechanical connectors 1807 are provided on circuit board 1803 to provide the electrical and mechanical connections between the modules and center hub 1801.

Structural face 1804 is preferably made of a rigid material to provide structural support for center hub 1801. Slots or apertures are provided about the circumference of structural surface 1804 to allow the modules, or connectors of modules, to pass through structural surface 1804 and reach connectors 1807 included therein. Structural core 1802 may also be made of a rigid material and may include standoffs 1811 or spacers 1811 on which circuit board 1803 may be mounted. Structural core 1802 may form a hollow cylinder such that an axle may be inserted through the center thereof. The structural components, such as structural core 1802, structural face 1804 and front and rear panels 1809, 1810, may be made of an electrically nonconductive, dielectric material such as glass, plastic, phenolic, or other nonconductive materials. In other applications, the structural components may be made of metals or other like materials. Materials with a high thermal conductivity may be chosen for the structural components to further provide an avenue of heat transfer from heat generating components within the modules.

Figure 17:
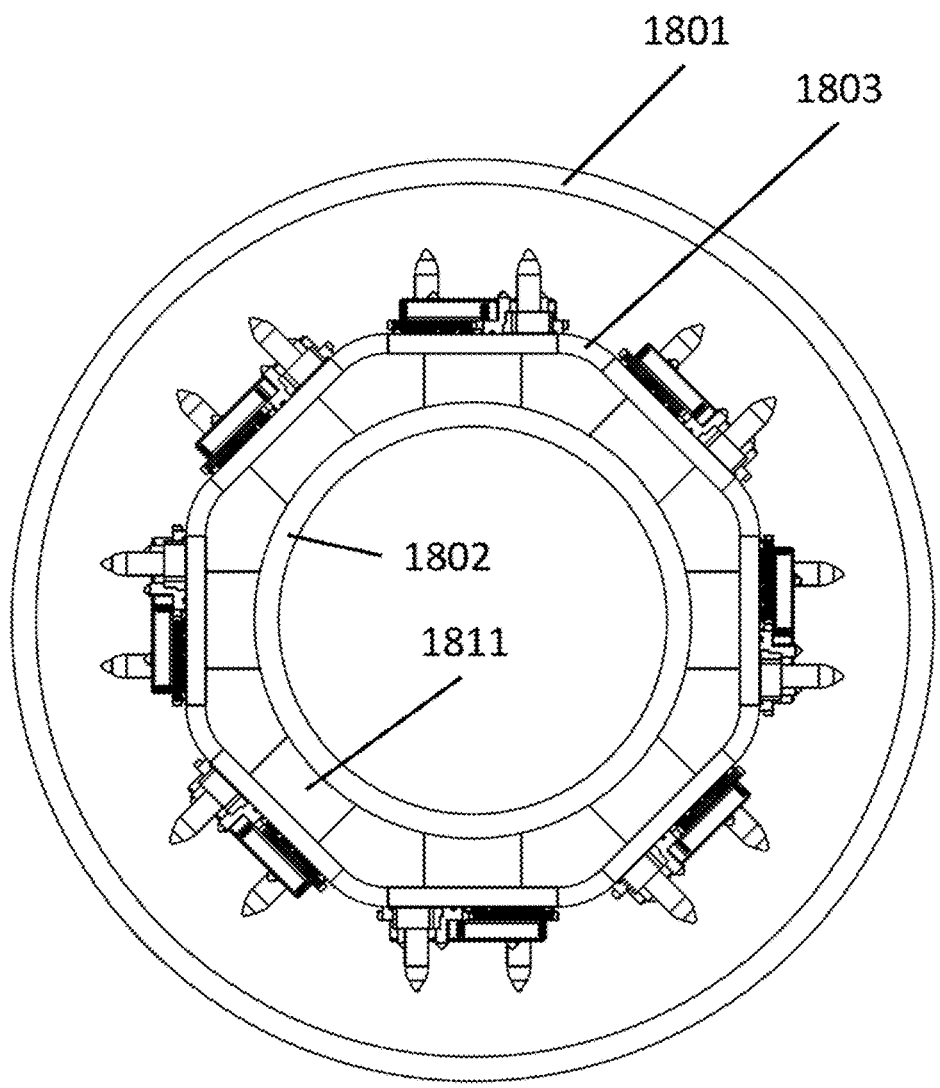
FIG. 17 provides a cross-sectional plan view of the example center hub illustrated in FIG. 16 in accordance with various embodiments.

FIG. 17 provides a cross-sectional plan view of the example center hub 1801 illustrated in FIG. 16. This example illustrates printed circuit board 1807 mounted on standoffs 1811 of structural core 1802. It also illustrates structural face 1804 surrounding structural core 1802 and circuit board 1803. Although not illustrated in FIG. 17 for clarity of depiction, front and rear panels 1809, 1810 maintain spacing between the inner components of center hub 1801 and structural face 1804.

As used herein, the term set may refer to any collection of elements, whether finite or infinite. The term subset may refer to any collection of elements, wherein the elements are taken from a parent set; a subset may be the entire parent set. The term proper subset refers to a subset containing fewer elements than the parent set. The term sequence may refer to an ordered set or subset. The terms less than, less than or equal to, greater than, and greater than or equal to, may be used herein to describe the relations between various objects or members of ordered sets or sequences; these terms will be understood to refer to any appropriate ordering relation applicable to the objects being ordered.

The terms "substantially" and "about" used throughout this disclosure, including the claims, are used to describe and account for small fluctuations, such as due to variations in processing. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

The term "coupled" refers to direct or indirect joining, connecting, fastening, contacting or linking, and may refer to various forms of coupling such as physical, optical, electrical, fluidic, mechanical, chemical, magnetic, electromagnetic, optical, communicative or other coupling, or a combination of the foregoing. Where one form of coupling is specified, this does not imply that other forms of coupling are excluded. For example, one component physically coupled to another component may reference physical attachment of or contact between the two components (directly or indirectly), but does not exclude other forms of coupling between the components such as, for example, a communications link (e.g., an RF or optical link) also communicatively coupling the two components. Likewise, the various terms themselves are not intended to be mutually exclusive. For example, a fluidic coupling, magnetic coupling or a mechanical coupling, among others, may be a form of physical coupling.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A fractal vibrorotational fluid flow actuator, comprising:
   a primary vibrational fluid flow actuator, comprising:
      a primary central body portion including a central axis,
      a plurality of primary blades extending radially from an outer circumference of the primary central body portion; and
      a plurality of primary tines configured to contact a surface of a device;
      wherein when the primary vibrorotational fluid flow actuator is placed such that at least one of the plurality of primary tines are in physical contact with the surface of the device, the primary vibrorotational fluid flow actuator rotates in response to vibration of the surface of the device such that the primary blades and primary central body portion rotate about the axis of the primary central body portion thereby inducing fluid flow in a fluid surrounding the fractal primary fluid flow actuator;
   a plurality of secondary vibrational fluid flow actuators, each positioned on a respective blade of the plurality of primary blades of the primary vibrational fluid flow actuator, each of the plurality of secondary vibrational fluid flow actuators comprising:
      a secondary central body portion including a central axis,
      a plurality of secondary blades extending radially from an outer circumference of the secondary central body portion; and
      a plurality of secondary tines positioned to contact a surface of the respective blade of the plurality of primary blades on which the secondary vibrational fluid flow actuator is positioned;
      wherein when a secondary vibrorotational fluid flow actuator is placed such that at least one of the plurality of secondary tines are in physical contact with the surface of the respective blade, vibration of the respective blade induces rotation of the secondary vibrorotational fluid flow actuator such that the secondary blades and secondary central body portion rotate about the axis of the secondary central body portion thereby inducing fluid flow in a fluid surrounding the secondary fluid flow actuator.

2. The vibrorotational fluid flow actuator of claim 1, wherein the plurality of primary tines comprises tines positioned on at least one of an outer periphery of the primary vibrational fluid flow actuator, an inner surface of the primary central body portion the primary vibrational fluid flow actuator, a top surface of the primary central body portion the primary vibrational fluid flow actuator and an inner surface of the primary central body portion the primary vibrational fluid flow actuator.

3. The vibrorotational fluid flow actuator of claim 1, further comprising a second plurality of secondary vibrational fluid flow actuators, each positioned on a respective blade of the plurality of primary blades of the primary vibrational fluid flow actuator.

4. The vibrorotational fluid flow actuator of claim 1, wherein the primary vibrational fluid flow actuator further comprises a band positioned around an outer edge of the plurality of primary blades and further wherein the plurality of primary tines are positioned about an outer surface of the band.

5. The vibrorotational fluid flow actuator of claim 4, wherein the band comprises a continuous band encircling an outer edge of the plurality of primary blades.

6. The vibrorotational fluid flow actuator of claim 4, wherein the band comprises a plurality of band segments wherein each segment is attached to the outer edge of a corresponding one or more of the plurality of primary blades, and wherein a tine of the plurality of primary tines is disposed on an outer surface of a band segment.

7. The vibrorotational fluid flow actuator of claim 1, wherein the plurality of secondary tines comprises tines positioned on an outer periphery of each secondary vibrational fluid flow actuator, wherein when a secondary vibrorotational fluid flow actuator is positioned on its respective primary blade within a wall surrounding the secondary vibrorotational fluid flow actuator circumferentially and at least some of the tines are in physical contact with an inner surface of the wall, vibration of the primary vibrorotational fluid flow actuator induces rotation of the secondary vibrorotational fluid flow actuator such that the secondary blades and secondary central body portion rotate about the axis of the secondary central body portion thereby inducing fluid flow in a fluid surrounding the secondary vibrorotational fluid flow actuator.

8. The vibrorotational fluid flow actuator of claim 7, wherein a secondary vibrorotational fluid flow actuator further comprises a band positioned around an outer edge of the plurality of secondary blades, and wherein the plurality of secondary tines of the secondary vibrorotational fluid flow actuator are positioned about an outer surface of the band.

9. The vibrorotational fluid flow actuator of claim 1, further comprising a plurality of tertiary vibrational fluid flow actuators, each positioned on a respective blade of the plurality of secondary blades of the secondary vibrational fluid flow actuator, each of the plurality of tertiary vibrational fluid flow actuators comprising:
  a tertiary central body portion including a central axis,
  a plurality of tertiary blades extending radially from an outer circumference of the tertiary central body portion; and
  a plurality of tertiary tines positioned to contact a surface of the respective blade of the plurality of secondary blades on which the tertiary vibrational fluid flow actuator is positioned;
  wherein when the tertiary vibrorotational fluid flow actuator is placed such that at least one of the plurality of tertiary tines are in physical contact with the surface of the respective secondary blade, vibration of the respective secondary blade induces rotation of the tertiary vibrorotational fluid flow actuator such that the tertiary blades and tertiary central body portion rotate about the axis of the tertiary central body portion thereby inducing fluid flow in a fluid surrounding the tertiary fluid flow actuator.

10. The vibrorotational fluid flow actuator of claim 9, wherein a tertiary vibrorotational fluid flow actuator further comprises a band positioned around an outer edge of the plurality of tertiary blades, and wherein the plurality of tertiary tines of the tertiary vibrorotational fluid flow actuator are positioned about an outer surface of the band.

* * * * *